(12) United States Patent
Hallam et al.

(10) Patent No.: US 10,923,618 B2
(45) Date of Patent: Feb. 16, 2021

(54) METHOD FOR MANUFACTURING A PHOTOVOLTAIC DEVICE

(71) Applicant: NEWSOUTH INNOVATIONS PTY LIMITED, Sydney (AU)

(72) Inventors: Brett Jason Hallam, New South Wales (AU); Stuart Ross Wenham, Cronulla (AU); Roland Einhaus, Bourgoin-Jallieu (FR)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 16/316,691

(22) PCT Filed: Jul. 12, 2017

(86) PCT No.: PCT/AU2017/050719
§ 371 (c)(1),
(2) Date: Jan. 10, 2019

(87) PCT Pub. No.: WO2018/009974
PCT Pub. Date: Jan. 18, 2018

(65) Prior Publication Data
US 2019/0157494 A1 May 23, 2019

(30) Foreign Application Priority Data

Jul. 12, 2016 (AU) ................................ 2016902733

(51) Int. Cl.
*H01L 31/00* (2006.01)
*H01L 31/18* (2006.01)
(Continued)

(52) U.S. Cl.
CPC ........ *H01L 31/1868* (2013.01); *H01L 31/028* (2013.01); *H01L 31/03682* (2013.01);
(Continued)

(58) Field of Classification Search
None
See application file for complete search history.

(56) References Cited

U.S. PATENT DOCUMENTS 4,279,671 A * 7/1981 Komatsu ........... H01L 21/32155
438/310
2004/0048453 A1 * 3/2004 Kang ..................... C30B 13/00
438/486
(Continued)

FOREIGN PATENT DOCUMENTS

EP 2 648 235 A2 10/2013
WO 2 648 235 A2 9/2013
(Continued)

OTHER PUBLICATIONS

P. Hammer et al., "Manipulation of Hydrogen Charge States for Passivation of P-Type Wafers in Photovoltaics", IEEE Journal of Photovoltaics, vol. 4, Issue 5, Sep. 2014.
(Continued)

*Primary Examiner* — Reema Patel
(74) *Attorney, Agent, or Firm* — Ajaya A. Jagtiani; Miles & Stockbridge P.C.

(57) ABSTRACT

The present disclosure provides methodologies for manufacturing high efficiency silicon photovoltaic devices using hydrogen passivation to improve performance. The processing techniques disclosed use tailored thermal processes, sometimes coupled with exposure to radiation to enable the use of cheaper silicon material to manufacture high efficiency photovoltaic devices.

8 Claims, 20 Drawing Sheets

(51) Int. Cl.
   *H01L 31/0368* (2006.01)
   *H01L 31/072* (2012.01)
   *H01L 31/078* (2012.01)
   *H01L 31/20* (2006.01)
   *H01L 31/028* (2006.01)
   *H01L 31/068* (2012.01)
   *H01L 31/0376* (2006.01)

(52) U.S. Cl.
   CPC ...... *H01L 31/03762* (2013.01); *H01L 31/068* (2013.01); *H01L 31/0682* (2013.01); *H01L 31/072* (2013.01); *H01L 31/078* (2013.01); *H01L 31/182* (2013.01); *H01L 31/1804* (2013.01); *H01L 31/1864* (2013.01); *H01L 31/202* (2013.01); *Y02E 10/546* (2013.01); *Y02E 10/547* (2013.01); *Y02P 70/50* (2015.11)

(56) References Cited

U.S. PATENT DOCUMENTS

| | | |
|---|---|---|
| 2008/0075840 A1 | 3/2008 | Enjalbert et al. |
| 2011/0162716 A1 | 7/2011 | Herguth et al. |
| 2013/0298984 A1 | 11/2013 | Kherani et al. |
| 2014/0360571 A1 | 12/2014 | Ji et al. |
| 2015/0132881 A1* | 5/2015 | Wenham ............. H01L 31/1868 438/58 |
| 2016/0141445 A1 | 5/2016 | Herguth et al. |

FOREIGN PATENT DOCUMENTS

| | | |
|---|---|---|
| WO | 2013/173867 A1 | 11/2013 |
| WO | 2013/180653 A1 | 12/2013 |

OTHER PUBLICATIONS

International Search Report received in Application No. PCT/AU2017/050719 dated Oct. 9, 2017.
Partial Supplementary European Search Report received in European Application No. 17826685.4 dated May 23, 2019.
Extended European Search Report received in EP Application No. 17826685.4 dated Oct. 8, 2019.

* cited by examiner

100

102 – Providing a substrate comprising doped silicon material with a first polarity 104 – Forming a region of silicon material with a second polarity (opposite to the first polarity) into the doped silicon material 106 – Performing a first hydrogen passivation process at a temperature above 500°C in a manner such that excess minority carriers are generated in the silicon material 108 – Forming metallic contacts to extract charge carriers from the silicon material 110 – A second hydrogen passivation process at a temperature below 500°C to generate excess minority carriers in the silicon material

FIGURE 1

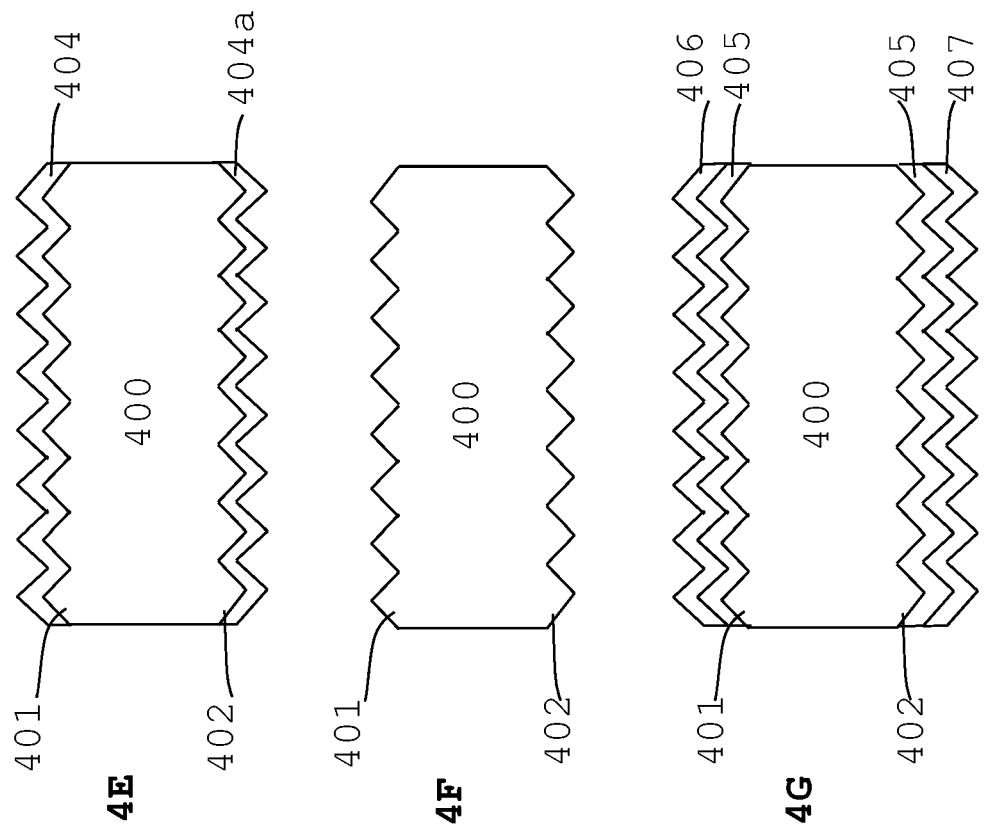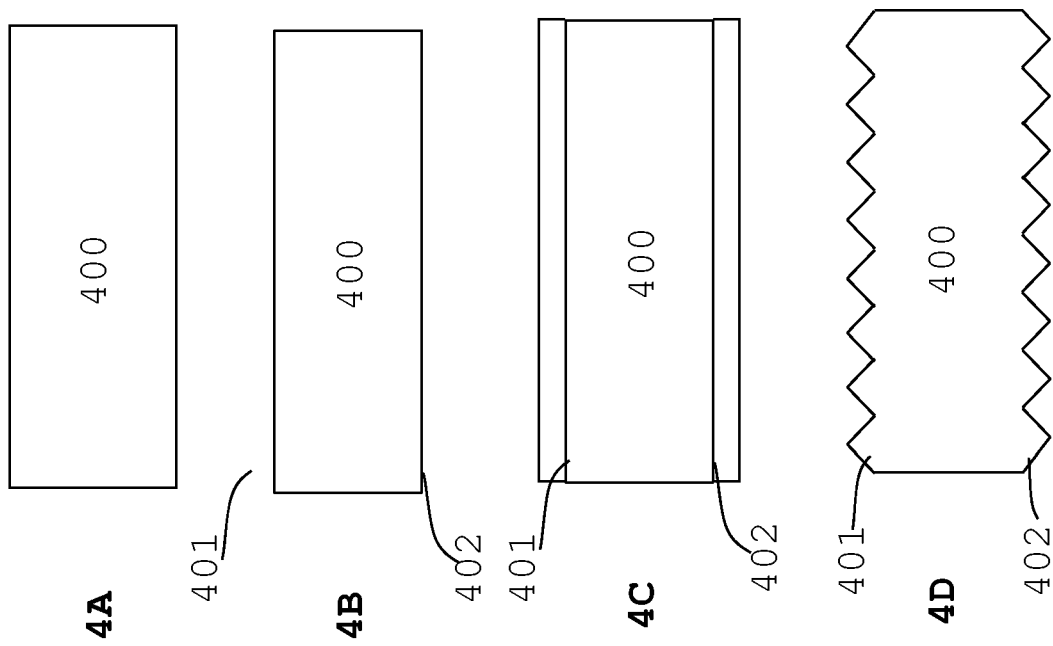
FIGURE 4a

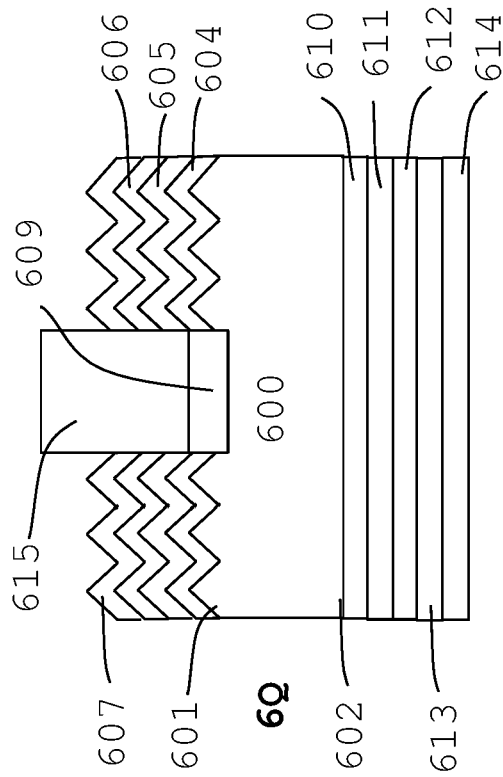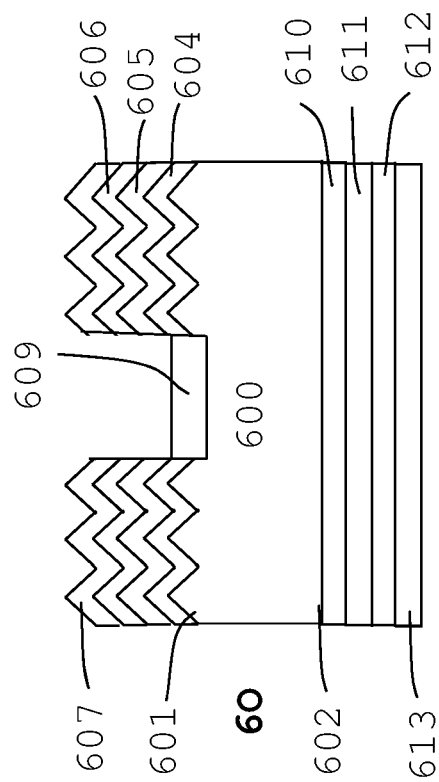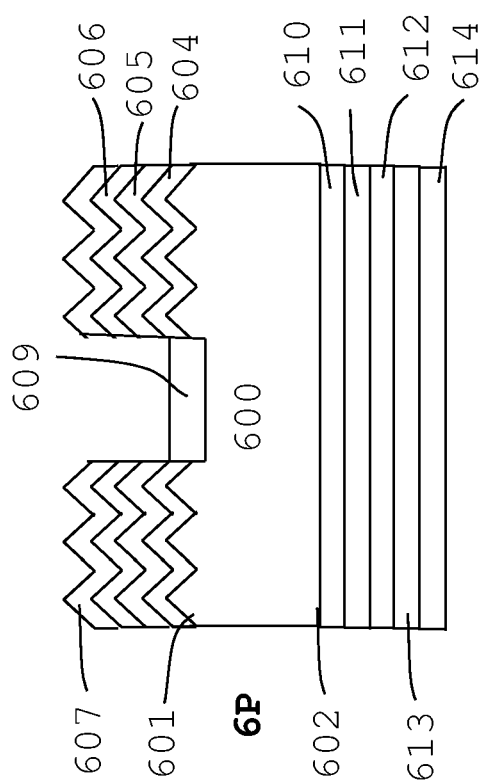
FIGURE 6c

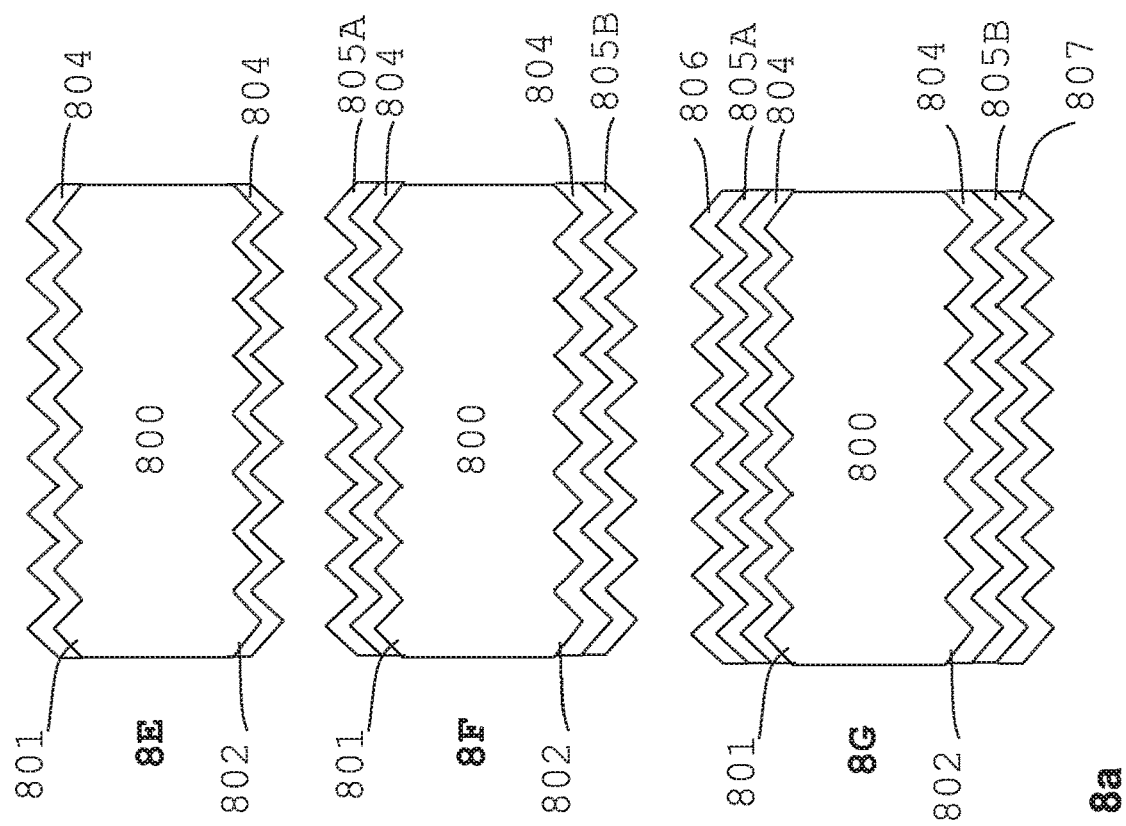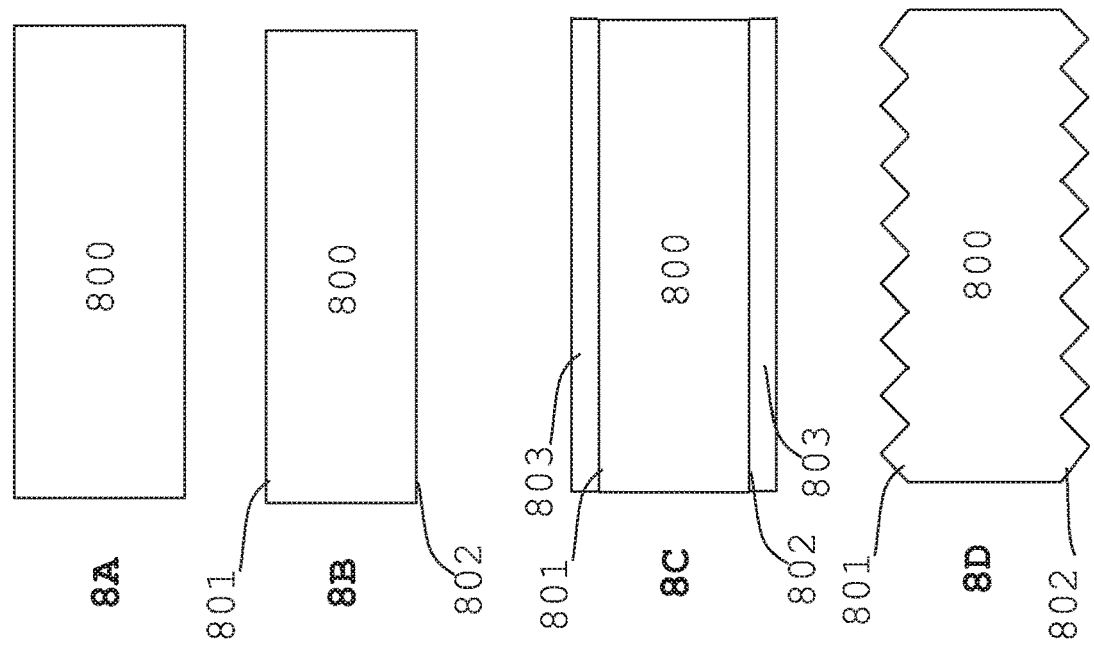
FIGURE 8a

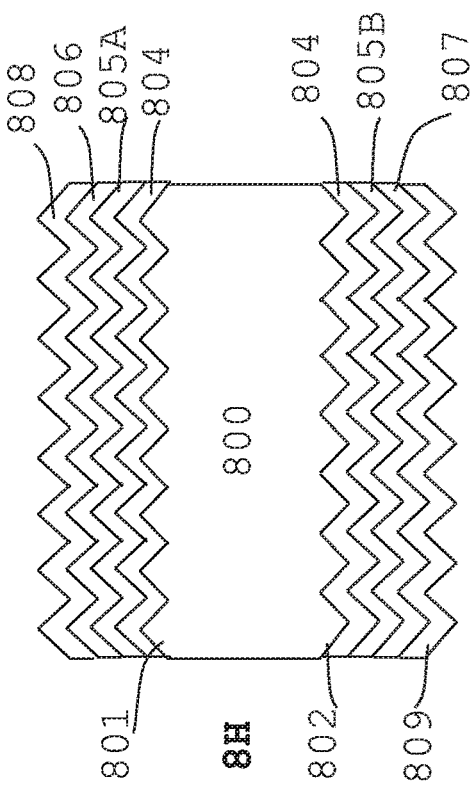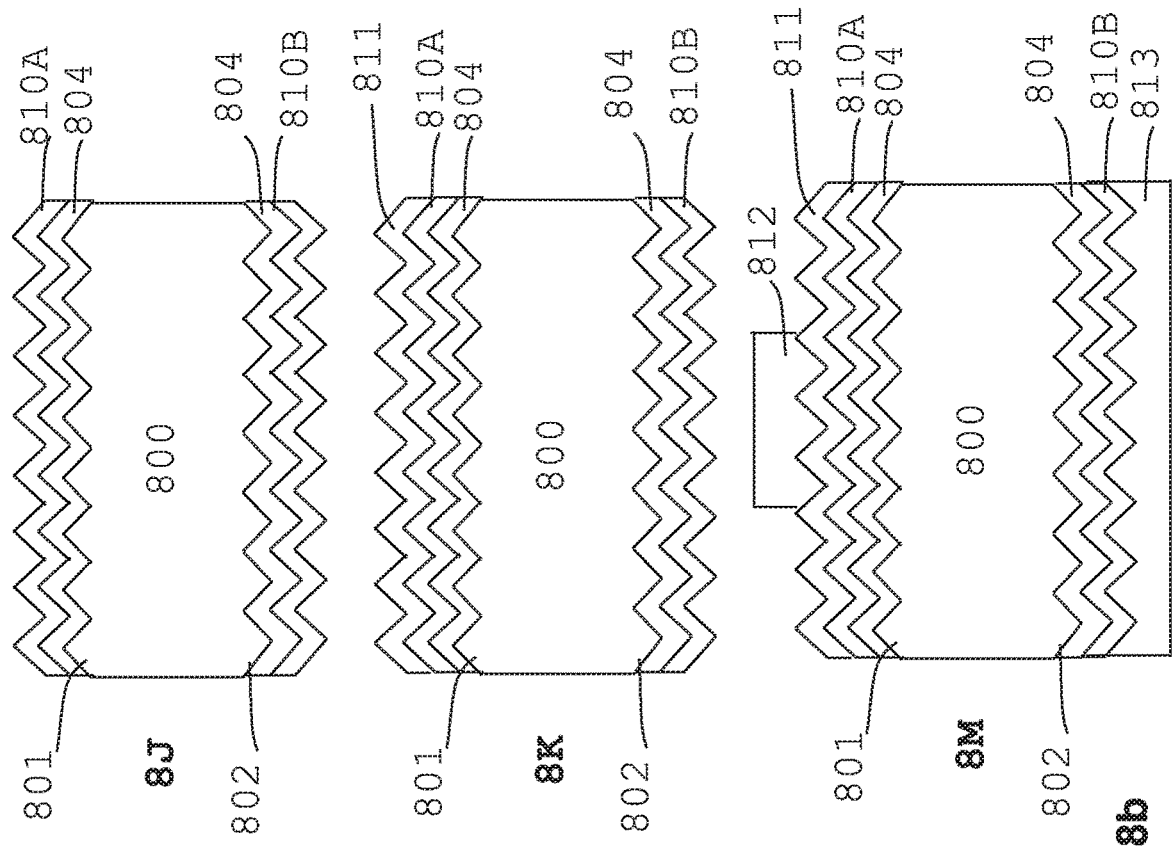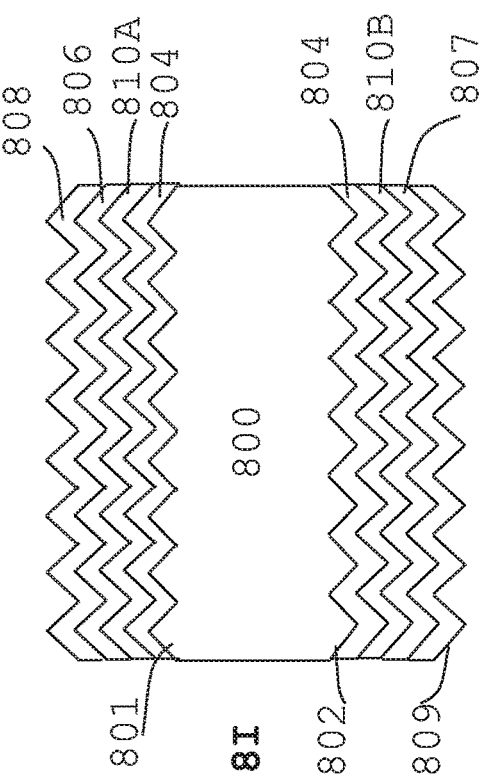
FIGURE 8b

METHOD FOR MANUFACTURING A PHOTOVOLTAIC DEVICE

FIELD OF THE INVENTION

The present invention generally relates to methods for manufacturing photovoltaic devices. In particular, the invention relates to manufacturing methods for improving the efficiency of photovoltaic cells.

BACKGROUND OF THE INVENTION

Silicon is the main semiconductor material used to fabricate today's commercial photovoltaic devices. The majority of commercial photovoltaic devices are fabricated from a monocrystalline or polycrystalline silicon wafer. A p-n junction is formed in the silicon wafer by, for example, diffusing n-type atoms in a p-type silicon wafer.

A large amount of photovoltaic devices are fabricated using boron doped silicon wafers. In these wafers, electrically active defects form when the wafers are exposed to radiation, such as visible light. Similarly polycrystalline wafers are known to contain a wide variety of metal impurities which may subsequently change form and introduce recombination centers. Electrically active defects throughout a photovoltaic device affect the lifetime of charge carriers causing reduced performance.

A number of techniques have been used in the art to improve efficiency of photovoltaic devices. For example, during the formation of photovoltaic devices, cell structures are exposed to high temperatures and/or electromagnetic radiations (light) to rapidly activate defect centres followed by passivation of the activated defects. Additionally, bulk lifetimes may also be improved through hydrogenation or gettering processes.

Another way to improve photovoltaic device efficiency is by improving the electrical quality of the silicon material. For example, in the case of conventional screen-printed photovoltaic devices, firing processes over 800° C. are used to form metal-silicon contacts. The firing processes used, typically in the presence of aluminium pastes, result a melting of aluminium and silicon, and the formation of aluminium-silicon alloyed $p^+$ regions.

Typical high efficiency silicon photovoltaic devices fabricated with crystalline silicon/amorphous silicon require a high silicon wafer quality with multi millisecond bulk lifetimes. A primary reason for this is the inability to hydrogenate the bulk of the material after the deposition of the hydrogen containing dielectric layers of amorphous silicon using conventional processing sequences. Any such attempts to improve the bulk passivation at temperatures above 200° C. after the deposition of the amorphous silicon layers can result in a deterioration of surface passivation, with detrimental effects to the device performance.

In addition, the typical processing sequences used for the high efficiency devices with hetero-interfaces do not include high temperature steps to allow improvements in the electrical quality of the silicon.

There is a common belief that high efficiency silicon photovoltaic devices with hetero-interfaces of crystalline/amorphous silicon can only be realised on wafers with high initial bulk lifetimes predominantly free of performance limiting impurities or defects.

There is a need in the art for a method for forming high efficiency silicon cells without using high quality silicon material.

SUMMARY OF THE INVENTION

In accordance with the first aspect, the present invention provides a method for forming a homo-junction silicon photovoltaic device, the method comprising the steps of:
 providing a substrate comprising doped silicon material with a first polarity;
 forming a region of silicon material with a second polarity into the doped silicon material; the second polarity being opposite to the first polarity; and
 performing a first hydrogen passivation process at a temperature above 500° C. in a manner such that excess minority carriers are generated in the silicon material;
 forming metallic contacts to extract charge carriers from the silicon material; and
 performing a second hydrogen passivation process at a temperature below 500° C. in a manner such that excess minority carriers are generated in the silicon material;
 wherein the first or the second hydrogen passivation process enables passivation of electrically active defects in the bulk region of the silicon material.

In accordance with the second aspect, the present invention provides a method for forming a silicon hetero-junction photovoltaic device, the method comprising the steps of:
 providing a substrate comprising doped silicon material with a first polarity;
 performing a first hydrogen passivation process to the substrate at a temperature above 500° C. in a manner such that excess minority carriers are generated in the silicon material;
 subsequent to performing the first hydrogen passivation, forming a first layer of intrinsic amorphous silicon onto a first surface of the substrate;
 forming a layer of doped amorphous silicon material with a first polarity onto a portion of the first layer;
 forming a second layer of intrinsic amorphous silicon onto a second surface of the substrate; the second surface being opposite to the first surface;
 forming a layer of doped amorphous silicon material with a second polarity onto a portion of the second layer; the second polarity being opposite to the first polarity; and
 performing a second hydrogen passivation process at a temperature below 500° C. in a manner such that excess minority carriers are generated in the amorphous silicon material;
 wherein the first or the second hydrogen passivation process enables passivation of electrically active defects in the bulk region of the silicon material.

In an embodiment, the method further comprises the step of depositing a sacrificial layer that contains excess hydrogen on the doped silicon material, prior to forming the layer of intrinsic amorphous silicon.

In an embodiment, the method further comprises the step of depositing a tunneling dielectric layer on the doped silicon material prior to forming the layer of intrinsic amorphous silicon. The tunneling layer may contain oxygen.

In accordance with the third aspect, the present invention provides a method for forming a hybrid silicon photovoltaic device, the method comprising the steps of
 providing a substrate comprising doped silicon material;
 forming a region of silicon material with a first polarity into the doped silicon material on a first surface of the substrate; and
 performing a first hydrogen passivation process at a temperature above 500° C. in a manner such that excess minority carriers are generated in the silicon material;

subsequent to performing a first hydrogen passivation, forming a layer of intrinsic amorphous silicon on a second surface of the substrate; the second surface being different to the first surface;

forming a layer of doped amorphous silicon material with the second polarity onto a portion of the layer of intrinsic amorphous silicon; the second polarity being opposite to the first polarity; and performing a second hydrogen passivation process at a temperature below 500° C. in a manner such that excess minority carriers are generated in the amorphous silicon material;

wherein the first or the second hydrogen passivation process enables passivation of electrically active defects in the bulk region of the silicon material.

The method may further comprise the step of depositing a dielectric layer that contains hydrogen on the region with the first polarity prior to performing a first hydrogen passivation process.

In accordance with the fourth aspect, the present invention provides a method for forming a poly-silicon photovoltaic device, the method comprising the steps of:

providing a substrate;

forming a first layer of poly-silicon with a first polarity onto a first region of the substrate;

forming a second layer of poly-silicon with a second polarity onto a second region of the substrate; the second polarity being opposite to the first polarity; and performing a first hydrogen passivation process at a temperature above 500° C. in a manner such that excess minority carriers are generated in the silicon material;

forming metallic contacts to extract charge carriers from the first and the second layer of poly-silicon; and performing a second hydrogen passivation process at a temperature below 500° C. in a manner such that excess minority carriers are generated in the poly-silicon material; the second hydrogen passivation process comprising the step of exposing the device to electromagnetic radiation; the electromagnetic radiation being such that photons with an energy higher than a bandgap of the poly-silicon material provide a power density of at least 10 mW/cm$^2$;

wherein the first or the second hydrogen passivation process enables passivation of electrically active defects in the bulk region of the silicon material.

In some embodiments, the first layer of poly-silicon with a first polarity and the second layer of poly-silicon with a second polarity are interdigitated.

In accordance with the fifth aspect, the present invention provides a method for forming a hybrid silicon photovoltaic device, the method comprising the steps of:

providing a substrate comprising doped silicon material;

forming a region of silicon material with a first polarity into the doped silicon material on a first surface of the substrate; and forming a layer of poly-silicon with a second polarity on a second surface of the substrate; the second polarity being opposite to the first polarity; the second surface being opposite to the first surface;

forming a dielectric layer that contains hydrogen on the region with the first polarity;

subsequent to forming the dielectric layer, performing a first hydrogen passivation process at a temperature above 500° C. in a manner such that excess minority carriers are generated in the silicon material; the first hydrogen passivation process comprising the step of exposing the device to electromagnetic radiation; the electromagnetic radiation being such that photons with an energy higher than a bandgap of the poly-silicon material provide a power density of at least 10 mW/cm$^2$;

forming metallic contacts to extract charge carriers from the first and the second layer of poly-silicon; and performing a second hydrogen passivation process at a temperature below 500° C. in a manner such that excess minority carriers are generated in the poly-silicon material;

wherein the first or the second hydrogen passivation process enables passivation of electrically active defects in the bulk region of the silicon material.

The method may comprise the step of depositing a tunneling dielectric layer on a second surface of the substrate, prior to forming the layer of poly-silicon.

In embodiments, at least one layer of poly-silicon is formed by thermally treating a layer of amorphous silicon and during the step of performing the second passivation process excess hydrogen formed during crystallisation of the amorphous silicon diffuses through the device to passivate electrically active defects. During the step of thermally treating the layer of amorphous silicon exposing the silicon to electromagnetic radiation excess carriers are generated in the silicon material to facilitate out-diffusion of hydrogen from the layer.

In accordance with the sixth aspect, the present invention provides a method for forming a photovoltaic device, the method comprising the steps of:

providing a silicon substrate;

performing a first hydrogen passivation process at a temperature above 500° C. in a manner such that excess minority carriers are generated in the silicon;

forming a carrier selective layer on a first region of the substrate; the carrier selective layer being such to minimise flow of carriers with a first polarity through the layer;

forming metallic contacts to extract charge carriers from the carrier selective layer; and performing a second hydrogen passivation process at a temperature below 500° C. in a manner such that excess minority carriers are generated in the silicon; the second hydrogen passivation process comprising the step of exposing the device to electromagnetic radiation; the electromagnetic radiation being such that photons with an energy higher than a bandgap of the silicon material provide a power density of at least 10 mW/cm$^2$;

wherein the first or the second hydrogen passivation process enables passivation of electrically active defects in the bulk region of the silicon material.

In one embodiment, one of the carrier selective layer comprises MoO$_x$.

In accordance with the seventh aspect, the present invention provides a method for forming a photovoltaic device, the method comprising the steps of:

providing a silicon substrate;

forming at least one hetero-junction structure at a first region of the substrate; the hetero-junction structure being arranged to generate excess carriers when exposed to radiation;

performing a first hydrogen passivation process at a temperature above 500° C. in a manner such that excess minority carriers are generated in the hetero-junction structure;

forming metallic contacts to extract charge carriers from the hetero-junction structure; and performing a second hydrogen passivation process at a temperature below 500° C. in a manner such that excess minority carriers are generated in the hetero-junction structure; the second hydrogen passivation process comprising the step of exposing the device to electromagnetic radiation; the electromagnetic radiation being such that photons with an energy higher than a bandgap of the hetero-junction material provide a power density of at least 10 mW/cm$^2$;

wherein the first hydrogen passivation process enables diffusion of hydrogen through the silicon and the second hydrogen passivation process enables passivation of electrically active defects in the hetero-junction.

In any of the aspects of the invention defined above, during the step of performing the first or the second passivation process, the device may be exposed to electromagnetic radiation in the presence of a hydrogen source; the electromagnetic radiation being such that photons with an energy higher than a bandgap of silicon provide a power density of at least 10 mW/cm$^2$.

The step of performing the first passivation process may be performed in a manner such that:

the concentration of hydrogen in the neutral charge state in the device is increased;

the amount of hydrogen released from dielectric layers is increased; or the diffusion of hydrogen through the silicon in the device is increased.

Further, the step of performing the second passivation process may be performed in a manner such that the reactivity of hydrogen in the device is increased or the diffusivity of hydrogen in the device is increased.

The step of performing the second passivation process may be performed at a temperature comprised between 100° C. and 500° C. or, in some instances, at a temperature between 250° C. and 450° C. or between 150° C. and 250° C. for a time period shorter than 60 seconds.

In some embodiments, the method further comprises the step of forming a layer of silicon material with a second polarity to getter impurities in the silicon material, the layer having a sheet resistance below 80 Ω/sq; and etching off a portion of the layer to remove the gettered impurities so that the sheet resistance of the etched layer increases to at least 100 Ω/sq.

In some other embodiments, the method comprises the step of exposing the sacrificial layer to radiation during the step of depositing a sacrificial layer that contains excess hydrogen to help the diffusion of hydrogen into the silicon.

In some embodiments, the method may comprise the step of exposing the device to radiation during the step of forming poly-silicon or the amorphous silicon to facilitate the diffusion of hydrogen into the silicon.

In accordance with the eighth aspect, the present invention provides a photovoltaic device manufactured in accordance with the method of any of the aspects above.

Advantageous embodiments of the present invention provide methods for manufacturing high efficiency silicon photovoltaic devices using hydrogen passivation to improve performance. Advantageously, processing techniques in accordance with embodiments enable the use of cheaper silicon material to manufacture high efficiency photovoltaic devices.

BRIEF DESCRIPTION OF THE DRAWINGS

Features and advantages of the present invention will become apparent from the following description of embodiments thereof, by way of example only, with reference to the accompanying drawings in which:

FIGS. 1, 3, 5, 7, 9 and 11 show flow diagrams with steps required to manufacture high efficiencies photovoltaic devices in accordance with embodiments;

FIGS. 2, 4, 6, 8, 10 and 12 show schematic diagrams of high efficiency photovoltaic devices fabricated using method in accordance with embodiments.

DETAILED DESCRIPTION OF EMBODIMENTS

Embodiments of the present invention relate to the field of photovoltaics and manufacturing of high efficiency silicon photovoltaic devices on silicon substrates. In particular, embodiments relate to the incorporation of thermal processes to enhance the lifetime of charge carriers in silicon for photovoltaic device structures with heavily doped p-type regions formed by means other than the alloying of aluminium and silicon.

The thermal processes described herein, coupled in some instances with exposure to radiation processes, allow improving the use of hydrogen to passivate defects in high efficiency photovoltaic devices, including defects related to the boron-oxygen complex. Multiple hydrogen passivation steps to improve the diffusion of hydrogen into and throughout the silicon bulk, the storage of hydrogen for subsequent passivation processes, and the passivation a variety of recombination active defects in the silicon. Furthermore, the methods allow the compatibility of bulk hydrogen passivation and high efficiency solar structures such as amorphous silicon layers, polycrystalline silicon layers, diffused p$^+$ regions and the metal contacts for such structures.

For example, according to one embodiment of the present invention, the efficiency of PERL photovoltaic devices can be improved by employing hydrogen passivation during fabrication steps of the cell.

Referring to FIG. 1, there is shown a flow diagram 100 with steps required to form a p-type PERL photovoltaic device. At step 102, a substrate made of p-type crystalline silicon material provided. After this, texturing is performed on both sides of the substrate. At step 104, a silicon region with a second polarity is formed into the substrate where the second polarity is opposite to the first polarity. At step 106, the above structure is processed to carry out hydrogen passivation. This step is generally carried out at a temperature higher than 500° C. At step 108, metallic contacts are formed on the photovoltaic device structure to extract charge carriers from the silicon. After the formation of metallic contacts, the structure undergoes a second hydrogen passivation process. During this passivation, temperature of the structure is maintained below 500° C. and excess minority carriers are also formed in the silicon material.

Figure 2A:
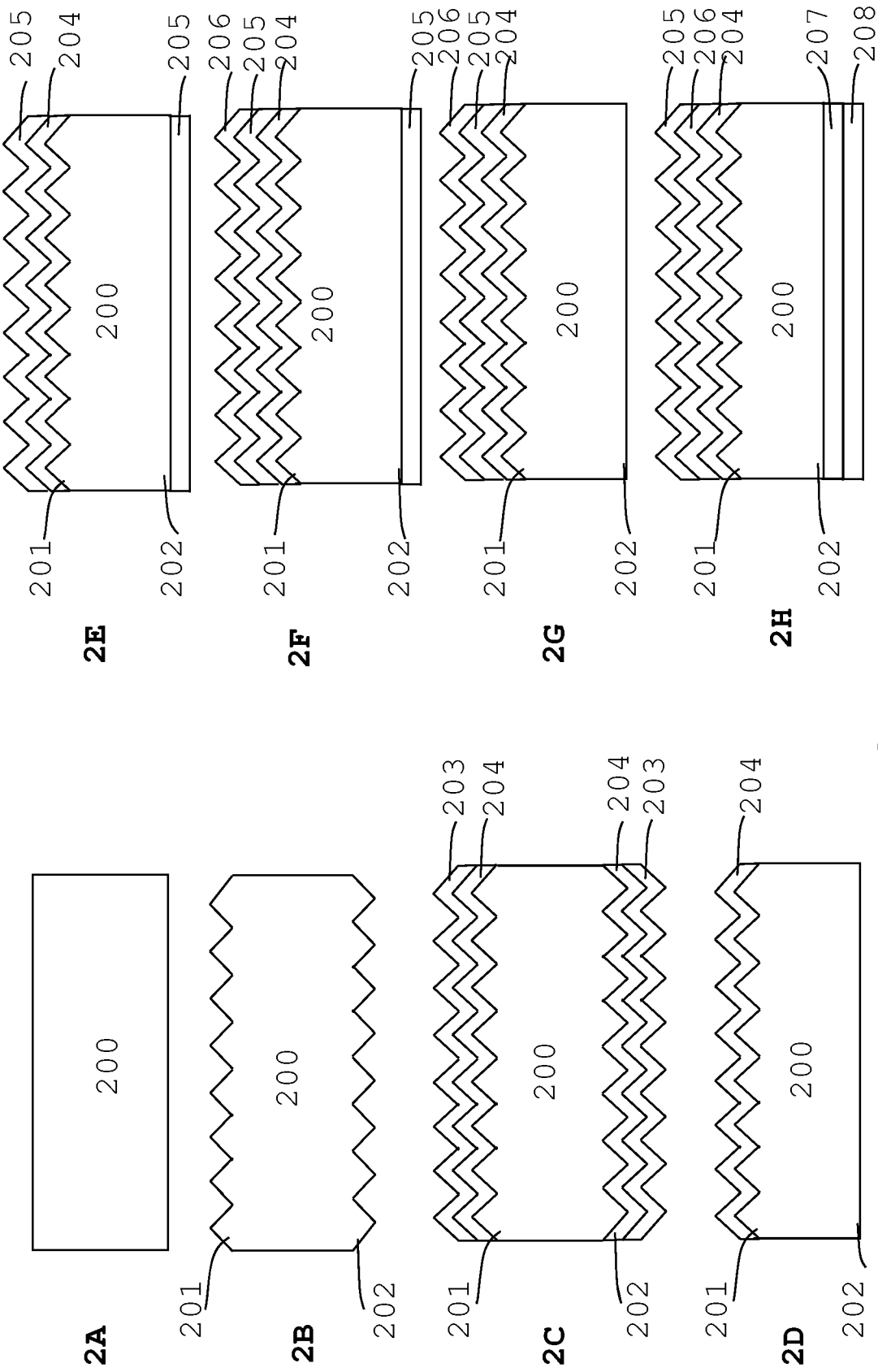
Figure 2B:
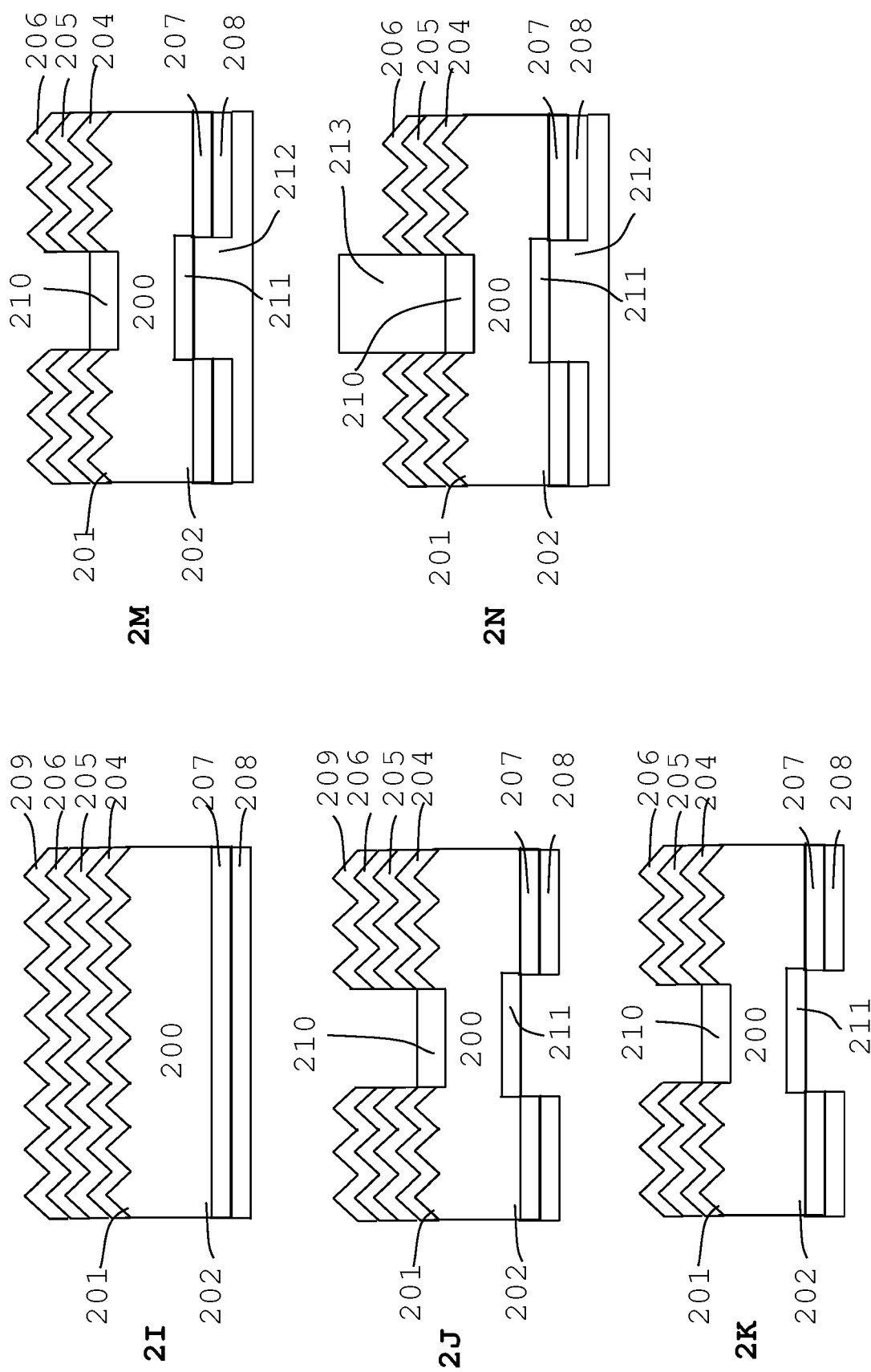

FIGS. 2a and 2b show schematic illustrations of a p-type PERL photovoltaic device through the fabrication process in accordance with embodiments. In operation 2A, a p-type crystalline silicon substrate 200 is provided. In operation 2B texturing is performed on the substrate to create surface 201 on the light-receiving surface of the device and surface 202 on the non-light receiving surface of the device. In operation 2C phosphorus diffusion is used to form heavily phosphorus doped regions 203 near the silicon surfaces with a surface dopant concentration higher than 1×10$^{20}$/cm$^3$ and lightly phosphorus doped regions 204 extending further into the silicon. The heavily diffused regions 203 are used to getter impurities from the bulk of the silicon. Gettering may utilize the push effect. In operation 2D a chemical etch is performed to remove layers 203 and 204 from the rear of the device and planarise the rear surface. The process may also be used to remove layer 203 from the light-receiving surface of the device and result in a surface doping concentration lower than $1 \times 10^{20}/cm^3$. In operation 2E a thermal oxidation is performed to grow a thin thermal oxide layer 205 on both surfaces of the device. In operation 2F a hydrogen-containing dielectric layer 206 such as PECVD silicon nitride is deposited onto the light-receiving surface of the device. In operation 2G a chemical process is optionally performed on the rear surface of the device to remove layer 205. In operation 2H the dielectric layers are formed on the rear surface. This may consist of a thin layer of aluminium oxide 207 formed by techniques such as atomic layer deposition or PECVD. A capping hydrogen-containing dielectric layer 208 is then formed such as PECVD of silicon nitride, silicon oxide, silicon oxy-nitride or silicon carbide.

Referring now to FIG. 2b, there is shown operation 2I where a phosphorus-containing layer is deposited onto the light-receiving surface of the device 209. In 2J a laser process is used to define contact openings and locally open dielectric layers 205 and 206 on the front surface of the device and form localized heavily phosphorus-doped regions 210. A laser process is used to locally open dielectric layers 207 and 208 on the rear of the device and produce localized p$^+$ doped regions 211 from layer 207 or additionally applied dopant sources. In 2K a chemical process is used to remove the residual phosphorus dopant layer 209. Successively, in a further operation, a thermal process is performed at a temperature over 500° C. incorporating minority carrier injection to release hydrogen from the dielectric layers, diffuse hydrogen into the bulk and passivate defects.

Alternatively, this thermal process may be performed after operation 2M. In this instance, preferably the temperature used is below the eutectic temperature of the silicon with the metal layer 212. For the case of aluminium, this is 577° C. If a higher temperature is used, a sufficiently low temperature is chosen to avoid the complete consumption of p$^+$ regions 211, prior to the recrystallization of the molten aluminium-silicon region.

Alternatively, the thermal process may be performed prior to operation 2M to allow for a wider range of processing temperatures.

In operation 2M a metal containing layer 212 is deposited onto the rear surface of the device such as by evaporation or sputtering of aluminium.

In operation 2N metal contacts 213 are formed on regions 210. This may be achieved by self-aligned light-induced plating, and could consist of a stack of nickel/copper/silver. This process may involve an additional thermal treatment to form a layer of nickel silicide, typically in the range of 250° C.-450° C., to minimise the diffusion of copper into the silicon. Preferably, this thermal process incorporates minority carrier injection to prevent the reactivation of defects passivated during the previous thermal processes.

An additional thermal process incorporating minority carrier injection is optionally performed on the device to passivate defects in the device after the deposition of the metal contacts at a lower temperature than operation 2N.

Figure 3:
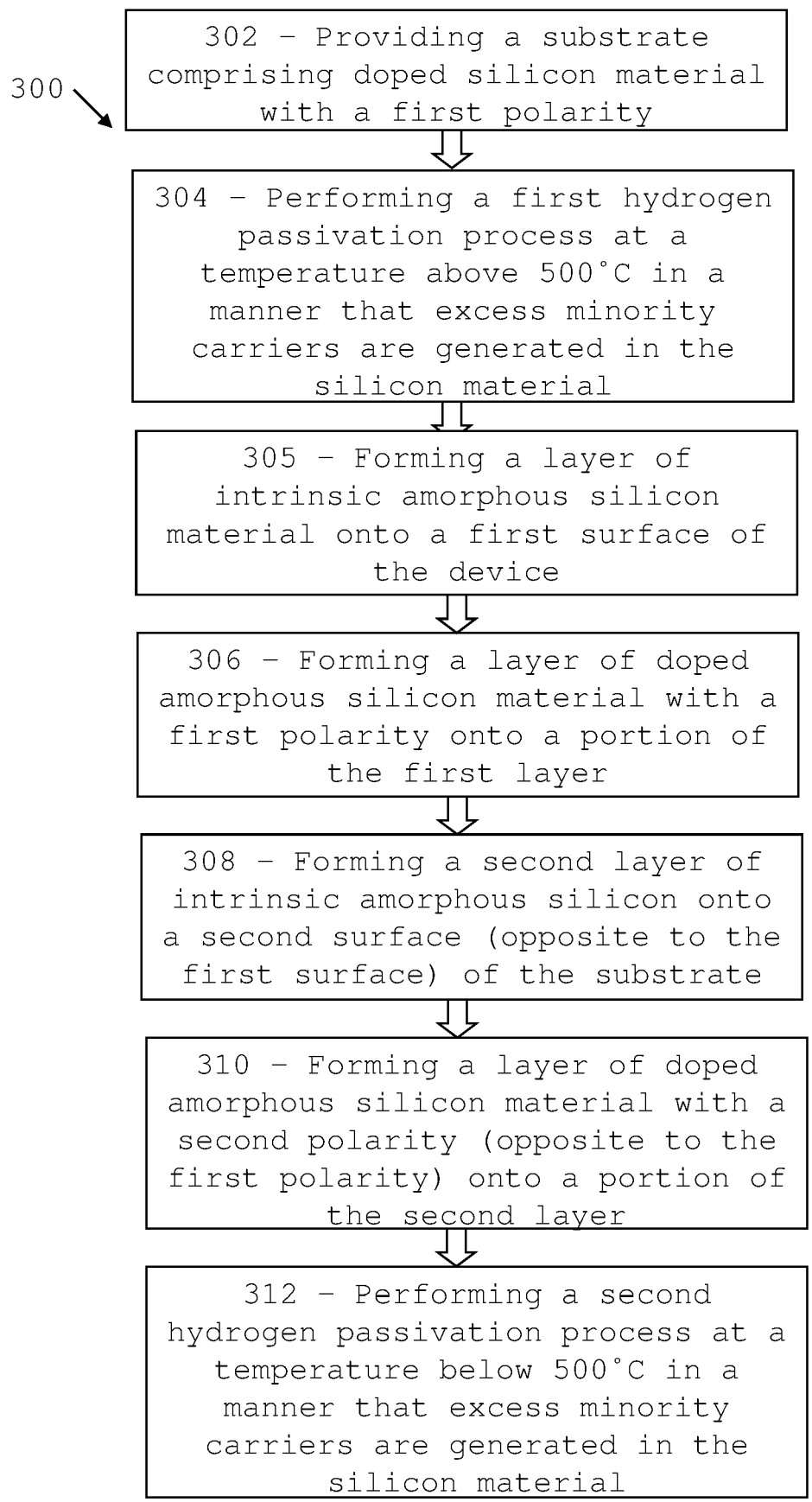

Referring now to FIG. 3, there is shown a flow diagram 300 with a series of steps required to form a Hetero-junction with Intrinsic Thin Layer (HIT) photovoltaic device.

At step 302 a substrate comprising doped silicon material with a first polarity is provided. Saw damage is etched and phosphorus diffusion is performed. Subsequently, the diffused layer is removed and the surface is textured. Further, a first hydrogen passivation process is performed at a temperature above 500° C. (step 304) in a manner that excess minority carriers are generated in the silicon material. For example, the device may be exposed to light while the hydrogen passivation step is performed. At step 305 a layer of intrinsic amorphous silicon material is formed onto a first region of the device. At step 306, a layer of doped amorphous silicon material with a first polarity, for example p-type, is formed onto a portion of the first layer. Subsequently, step 308, a second layer of intrinsic amorphous silicon is formed onto the opposite surface of the substrate and a layer of doped amorphous silicon material with a second polarity, for example n-type, is formed onto a portion of the second layer. Metallic contacts are then formed and a second hydrogen passivation process is performed at a temperature below 500° C. and excess minority carriers are generated in the silicon material.

Figure 4B:
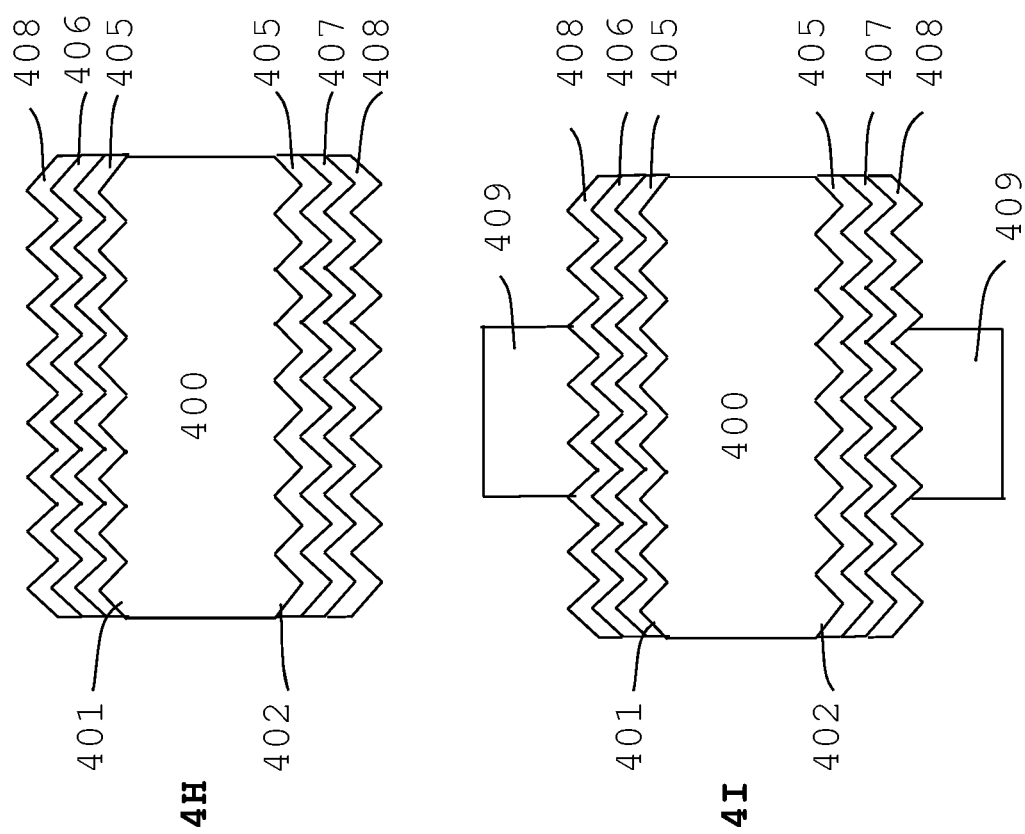

FIGS. 4a and 4b show schematic illustrations of a HIT photovoltaic device through the fabrication process in accordance with embodiments. In operation 4A, a crystalline silicon substrate 400 is provided. This may be n-type or p-type.

In operation 4B, a chemical etch is used to remove saw damage from the substrate to create surface 401 on the light-receiving surface of the device and surface 402 on the non-light receiving surface of the device.

In operation 4C, a phosphorus diffusion is used to form phosphorus doped regions 403 with an active phosphorus surface dopant concentration larger than $10^{20}/cm^3$ to getter impurities within the bulk. In operation 4D, a chemical etch is performed to remove layers 403 from the device and texture surfaces 401 and 402. In 4E a hydrogen source is provided to the photovoltaic device on one or more surfaces. This may involve the use of plasma with hydrogen-containing gases such as hydrogen ($H_2$), ammonia ($NH_3$) and/or silane ($SiH_4$). This may form a sacrificial dielectric layer 404 such as PECVD silicon nitride to act as a continuing hydrogen source during the subsequent operation. Illumination may be provided during the plasma process to assist with the manipulation of hydrogen charge states within the silicon and/or dielectric layer, and encourage the diffusion of hydrogen into the silicon.

Optionally, a thin dielectric layer 404a may be grown on one or more surfaces by techniques such as chemical oxidation or PECVD to reduce the out-diffusion of hydrogen in the subsequent operation. Preferably this layer can also act as a hydrogen source during the subsequent operation.

In operation 4F a thermal process incorporating minority carrier injection is performed at a temperature higher than 500° C. to diffuse hydrogen throughout the silicon as passivate defects within the device. Optionally, an additional illuminated annealing process is performed at a temperature below 500° C. The sacrificial layers 404 and 404a are then removed.

In operation 4G, dielectric layers of amorphous silicon are deposited onto the surfaces. On surface 401, this may comprise a thin stack of intrinsic amorphous silicon 405 and n-type amorphous silicon 406. On surface 402, this may comprise a thin stack of intrinsic amorphous silicon 405 and p-type amorphous silicon 407. In operation 4H, transparent conductive layers 408 are formed on the device. In operation 4I, metal contacts are formed on the device 409. Furthermore, a thermal process incorporating minority carrier injection is performed at a temperature below 500° C. to passivate defects in the device. Simultaneously, this may improve the contact resistance to the metal contacts.

Figure 5:
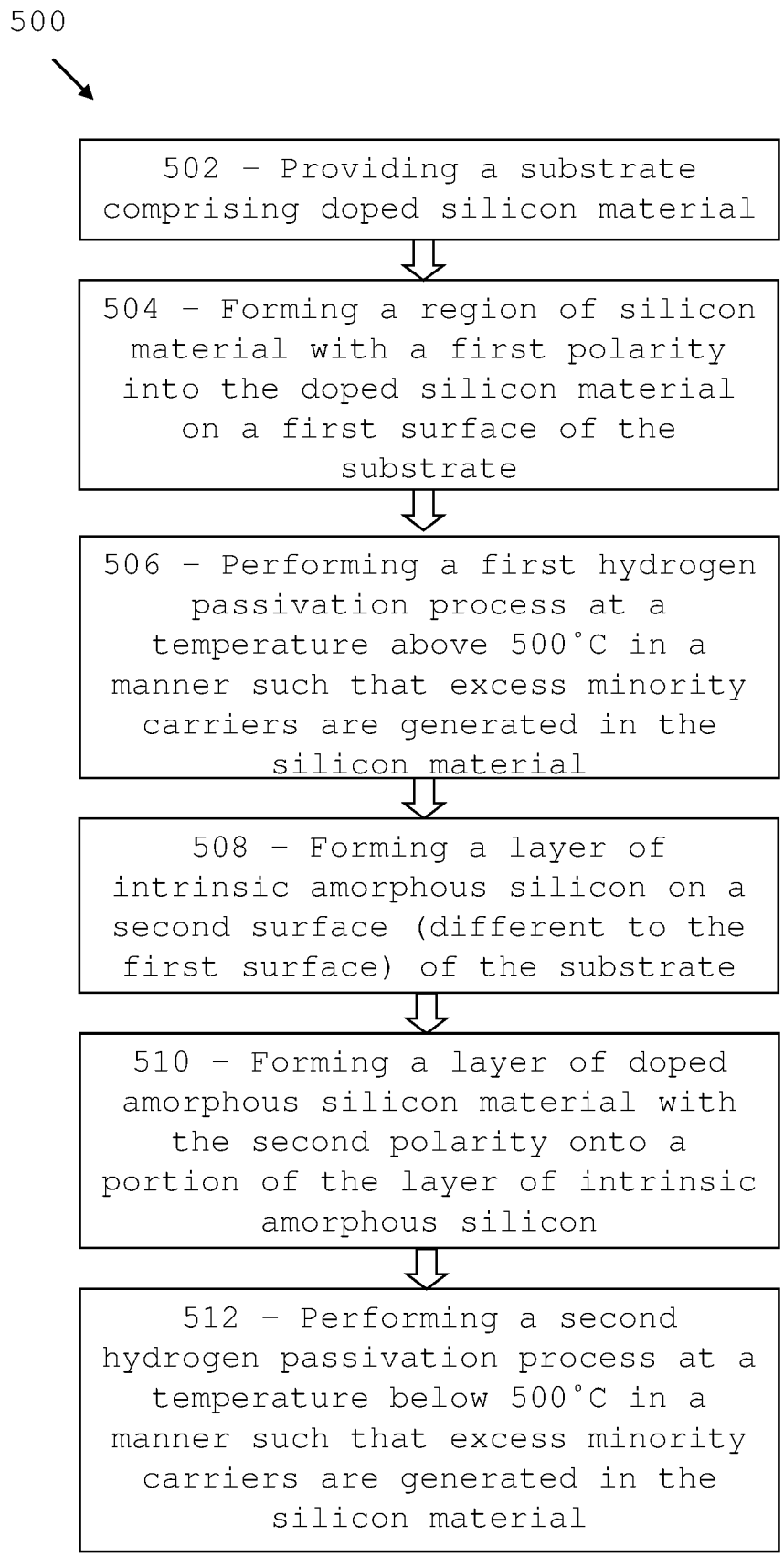

Referring now to FIG. 5, there is shown a flow diagram 500 with a series of steps required to form a hybrid homo-junction/amorphous silicon hetero-junction p-type contact photovoltaic device.

At step 502 a silicon substrate is provided and textured. Phosphorus is then diffused in the silicon to form a region of silicon material with a first polarity (n-type) on a first surface of the substrate, step 504. The rear side of the cell is then etched and the front diffusion lightened. Subsequently a thermal oxidation and PECVD step of the front region of the cell are performed. Further a capping layer is deposited and a phosphorous dopant source is provided to perform laser doping. After removing the dopant source, a first hydrogen passivation process at a temperature above 500° C. is performed in a manner such that excess minority carriers are generated in the silicon, step 506. After growing passivation oxide layers, a layer of intrinsic amorphous silicon is formed, step 508, and a layer of doped amorphous silicon material is formed onto a portion of the layer of intrinsic amorphous silicon, step 510. Subsequently, metallic contacts are formed at the front and the rear of the device and a second hydrogen passivation process is performed at a temperature below 500° C. in a manner such that excess minority carriers are generated in the silicon, step 512.

Figure 6A:
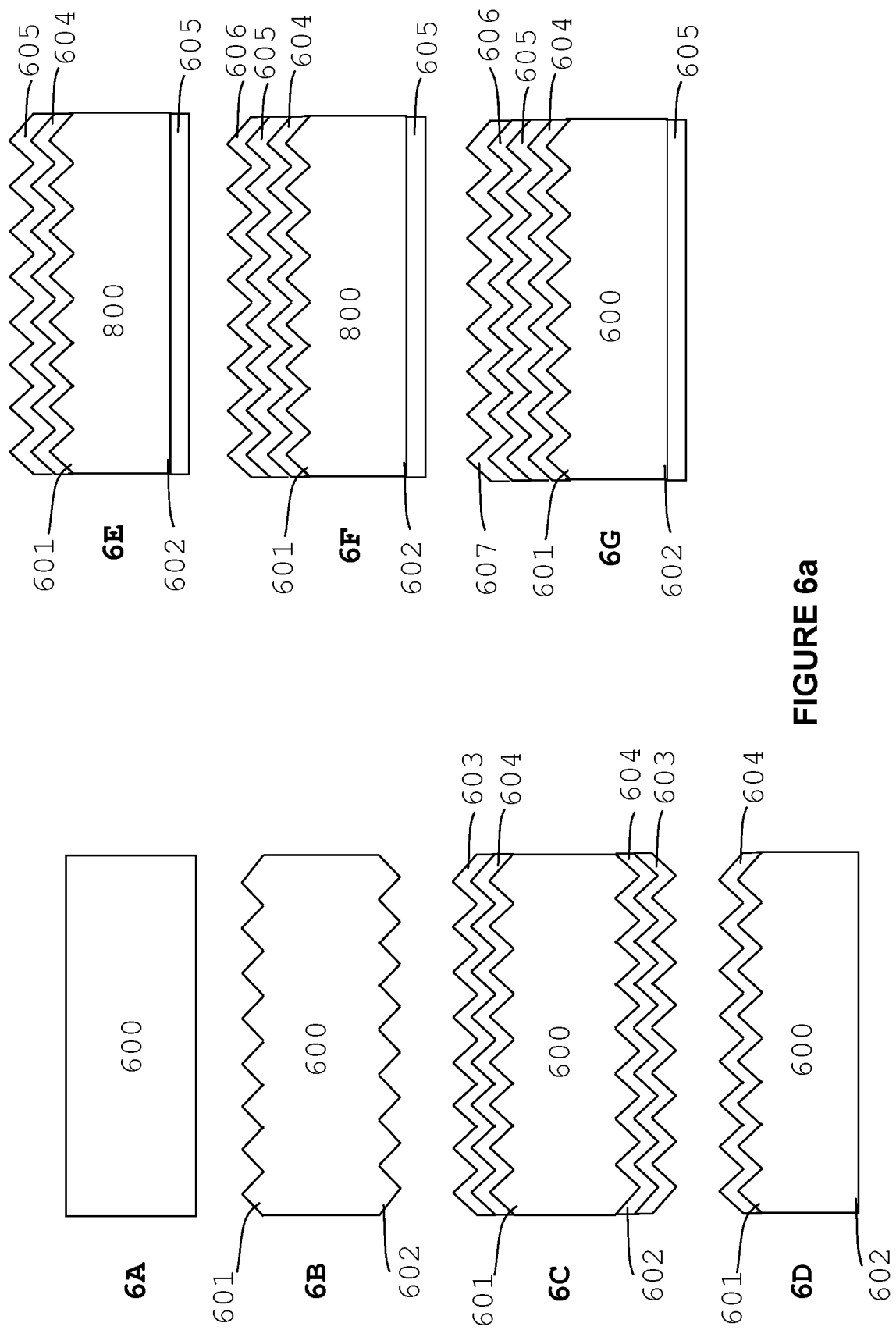
Figure 6B:
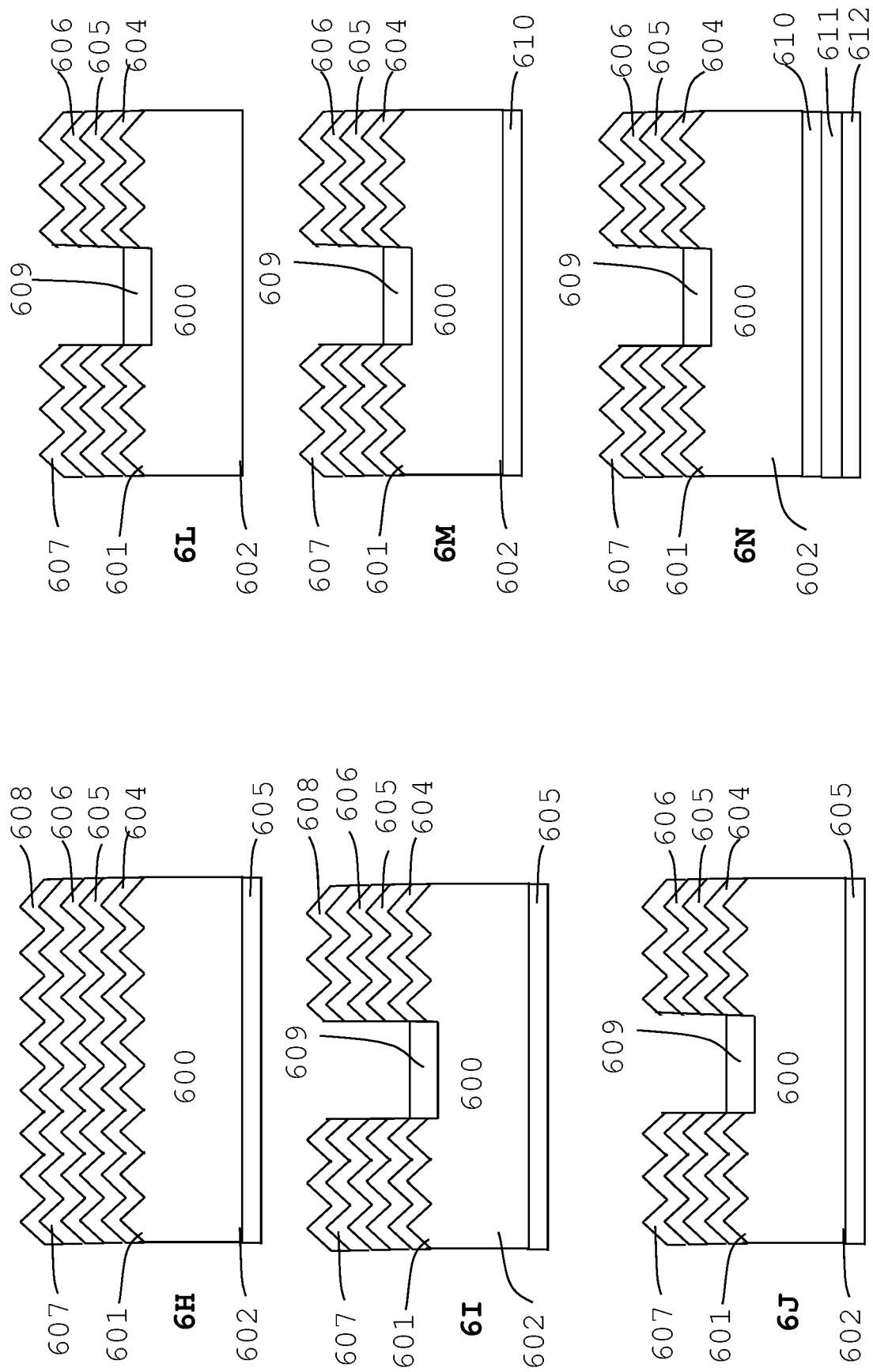

FIGS. 6a, 6b and 6c show schematic illustrations of a hybrid homo-junction/amorphous silicon hetero-junction p-type contact photovoltaic device through the fabrication process in accordance with embodiments.

In operation 6A, a crystalline silicon substrate 600 is provided. This may be n-type or p-type.

In operation 6B, texturing is performed on the substrate to create surface 601 on the light-receiving surface of the device and surface 602 on the non-light receiving surface of the device.

In operation 6C, a phosphorus diffusion is used to form heavily phosphorus doped regions 603 near the silicon surfaces and lightly phosphorus doped regions 604 extending further into the silicon. The heavily diffused regions 603 are used to getter impurities from the bulk of the silicon.

In operation 6D, a chemical etch is performed to remove layers 603 and 604 from the rear of the device and planarise the rear surface. The process may also be used to remove layer 603 from the light-receiving surface of the device and result in a surface doping concentration lower than $10^{20}/cm^3$.

In operation 6E, a thermal oxidation is performed to grow a thin thermal oxide layer 605 on both surfaces of the device.

In operation 6F, a hydrogen-containing dielectric layer 606 such as PECVD silicon nitride is deposited onto the light-receiving surface of the device. Optionally this process incorporates minority carrier injection.

In operation 6G, a dense capping layer 607 may optionally be provided on top of layer 606 to assist with blocking the effusion of hydrogen out of the top surface of layer 606 and therefore increase the diffusion of hydrogen from layer 606 through layers 605 and 603 and into the bulk silicon wafer 600.

In operation 6H, a phosphorus-containing layer 608 such as phosphoric acid is deposited onto the light-receiving surface of the device.

In operation 6I, a laser process is used to define contact openings and locally open dielectric layers 605, 606 and 607 on the front surface of the device and form localised heavily phosphorus-doped regions 609.

In operation 6J, a chemical process is used to remove the residual phosphorus dopant layer 608.

A hydrogenation process is then performed at a temperature above 500° C. to release hydrogen from the dielectric layers and diffuse hydrogen throughout the device and passivate defects within the device. Preferably, this process incorporates minority carrier injection using illumination. Optionally, contact definition operation 6I can be performed after with appropriate changes to the process flow.

In operation 6L a chemical process is optionally performed on the rear surface of the device to remove layer 605.

In operation 6M a tunnel oxide layer 610 is optionally grown on rear surface of the device.

In operation 6N, dielectric layers of amorphous silicon are deposited onto rear surface 602. This may comprise a thin stack of intrinsic amorphous silicon 611 and p-type amorphous silicon 612.

In operation 6O a transparent conductive layer 613 is formed on the device.

In operation 6P a metal contact 614 is formed on the rear of the device.

In operation 6Q metal contacts 615 are formed on regions 609. This may be achieved by self-aligned light-induced plating as disclosed in U.S. Pat. No. 6,429,039, and could consist of a stack of nickel/copper/silver. This process may involve an additional thermal treatment to form a layer of nickel silicide, typically in the range of 250° C. to 450° C., to prevent the diffusion of copper into the silicon. The process is also kept sufficiently short to avoid the crystallisation of the amorphous silicon layers. Layer 610 may be used to provide additional thermal stability for the amorphous silicon layer. Optionally, this thermal process incorporates minority carrier injection to prevent the reactivation of defects passivated during the previous thermal processes.

An additional thermal process incorporating minority carrier injection is then performed on the device to passivate defects in the device after the deposition of the metal contacts at a temperature below the temperature used for the operation 6K and the thermal process in 6Q. Optionally this is combined with the thermal process in operation 6Q.

Figure 7:
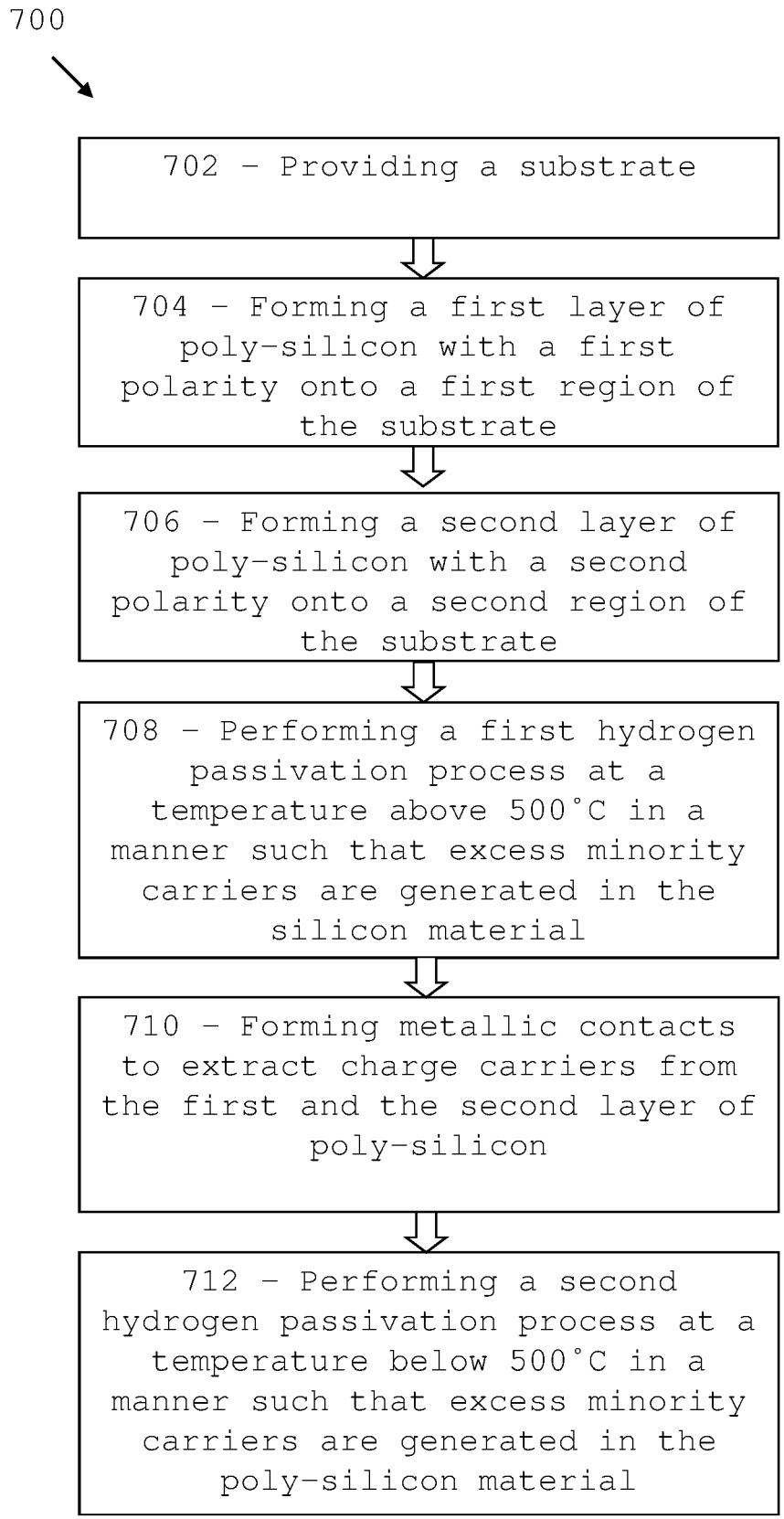

Referring now to FIG. 7, there is shown a flow diagram 700 with a series of steps required to form a p-type or n-type polysilicon photovoltaic device.

A silicon substrate is provided and textured, step 702. A layer of phosphorus is then diffused into the silicon and subsequently removed to remove defects. Tunnel oxides layers are grown before forming a first layer of poly-silicon with a first polarity onto a first region of the substrate (step 704) and a second layer of poly-silicon with a second polarity (step 706). The formation of the polysilicon layers may require a number of steps, such as deposition of polysilicon, deposition of dopant sources, deposition of oxide layers and thermal processes. The polysilicon layer may be interdigitated to form an interdigitated back contact photovoltaic device configuration.

After an antireflection coating is formed a first hydrogen passivation process at a temperature above 500° C. is performed in a manner such that excess minority carriers are generated in the silicon material, step 708. Subsequently, metallic contacts are formed to extract charge carriers from the first and the second layer of poly-silicon, step 710, and a second hydrogen passivation process at a temperature below 500° C. is performed while the device is exposed to radiation to generate excess carriers, step 712.

FIGS. 8a and 8b show schematic illustrations of a poly-silicon photovoltaic device through the fabrication process in accordance with embodiments.

In operation 8A, a crystalline silicon substrate 800 is provided. This may be n-type or p-type.

In operation 8B a chemical etch is used to texture the substrate to create surface 801 on the light-receiving surface of the device and surface 802 on the non-light receiving surface of the device.

In operation 8C, phosphorus diffusion is used to form phosphorus doped regions 803 with an active phosphorus surface dopant concentration larger than $10^{20}/cm^3$ to getter impurities within the bulk.

In operation 8D a chemical etch is performed to remove layers 803 from the device and texture surfaces 801 and 802.

In operation 8E tunneling dielectric layers 804 are grown on the surfaces.

In operation 8F polysilicon layers 805A and 805B are deposited onto layers 804. Layers 805A and 805B are noted as different layers, as during a subsequent operation they will be differently doped. Optionally, this process incorporates minority carrier injection with an intensity of photons capable of generating electron-hole pairs of more than 10 mW/cm$^2$, to diffuse hydrogen from the polysilicon layer into the silicon and passivate defects in the bulk silicon. In operation 8G an n-type dopant source 806 is provided on layer 805A. A p-type dopant source 807 is provided over layer 805B. In operation 8H oxide layers 808 and 809 are formed over regions 806 and 807, respectively. In operation 8I, a thermal process is performed to diffuse dopants from layers 806 and 807 to transform layer 805A and 805B into an n-type doped polysilicon layer 810A and p-type doped polysilicon layer 810B, respectively. In operation 8J, a chemical process is used to remove oxide layers 808 and 809, and dopant sources 806 and 807. In operation 8K, a hydrogen containing antireflection layer 811 is formed on the front surface of the device, this may include PECVD silicon nitride. In operation 8L a thermal process incorporating minority carrier injection is performed at a temperatures larger than 500° C. to diffuse hydrogen throughout the silicon as passivate defects within the device. In operation 8M metal contacts 812 and 813 are formed on the device. This may be achieved by plating, sputtering or evaporation. Here, this involves a patterned growth of contact 812 on the light receiving surface of the device. In operation 8N a thermal process incorporating minority carrier injection is performed at a temperature lower than 500° C. to passivate defects within the device.

Figure 9:
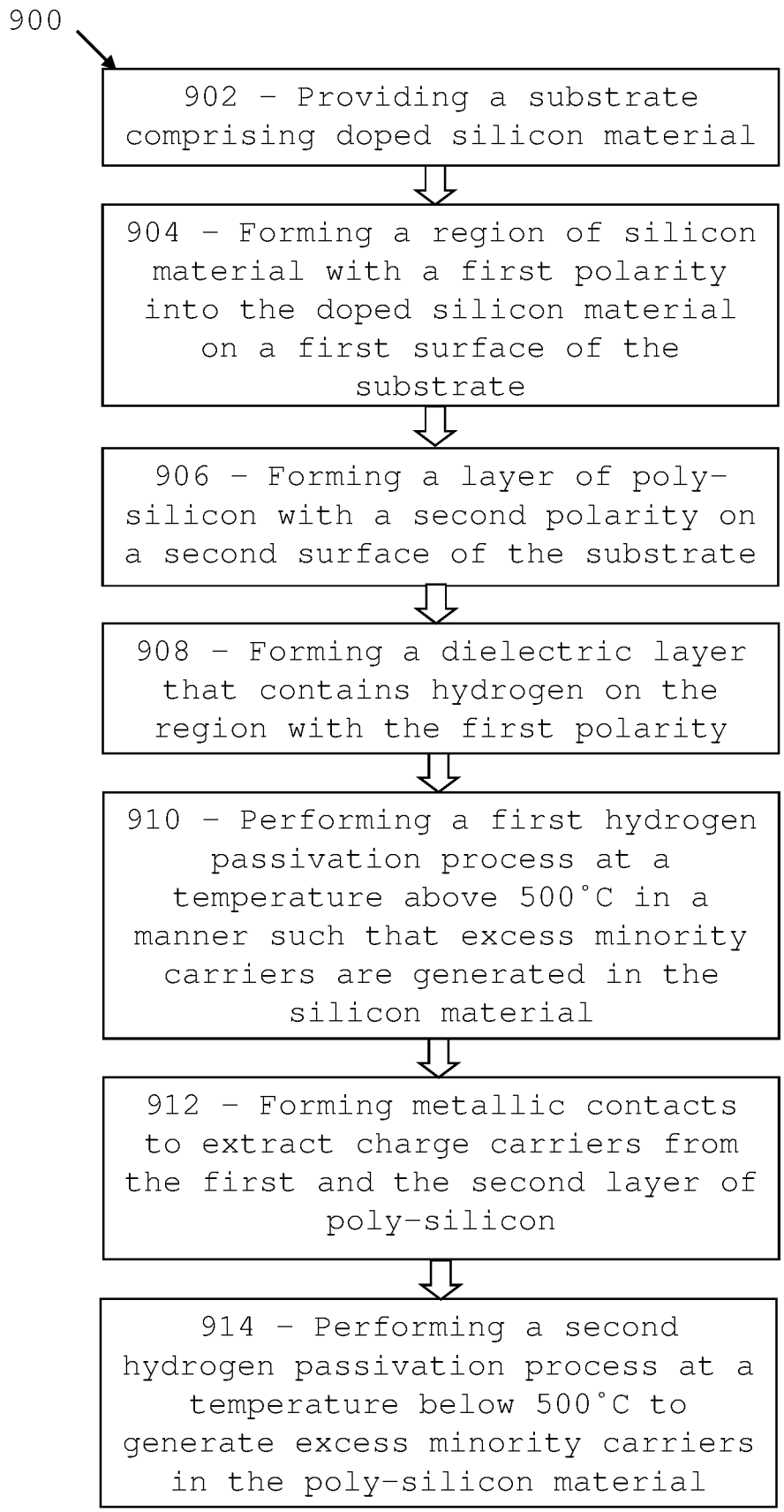

Referring now to FIG. 9, there is shown a flow diagram 900 with a series of steps required to form a photovoltaic device with a homo-junction and a hetero-junction formed from polysilicon.

A silicon substrate comprising doped silicon material is provided and textured, step 902. Phosphorus is then diffused in the silicon to form a region of silicon material with a first polarity (n-type) on a first surface of the substrate, step 904. The rear side of the cell is then chemically etched. The heavily phosphorous diffused layer is the removed from the first surface. Subsequently, a thermal oxidation is performed on both surfaces of the device and then the oxide layer is removed from the rear surface of the device using a chemical process. A tunnel oxide layer is then grown on the rear surface. Subsequent to this, a layer of p-type polysilicon of a second polarity is formed onto the tunnel oxide layer, step 906. An anti-reflection layer comprising of for example phosphoric acid is deposited onto the front surface of the device. After this, a laser process is used to form localised heavily phosphorus-doped regions followed by removal of the residual phosphorus dopant layer.

At step 908, a hydrogen-containing dielectric layer such as PECVD silicon nitride is deposited onto the region with the first polarity of the device.

At step 910, a first hydrogen passivation process at a temperature above 500° C. is performed to release hydrogen from the dielectric layers and diffuse hydrogen throughout the device and passivate defects within the device. This hydrogenation process is performed in a manner such that excess minority carriers are generated in the silicon.

At step 912, metal contacts are formed to extract charge carriers from the first and the second layer of poly-silicon.

A second hydrogen passivation process is performed at a temperature below 500° C. to generate excess minority carriers in the poly-silicon material, step 914.

Figure 10A:
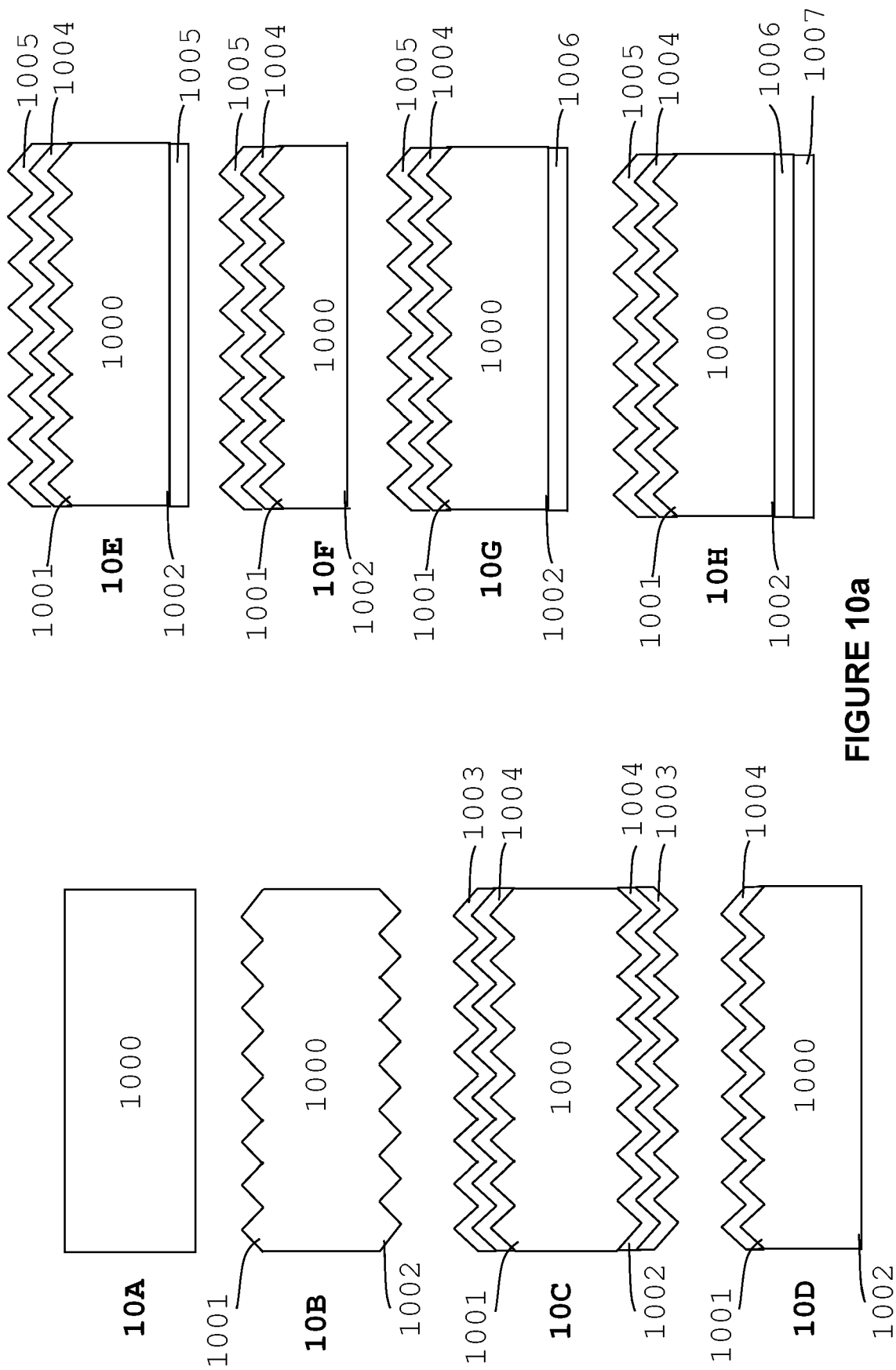
Figure 10B:
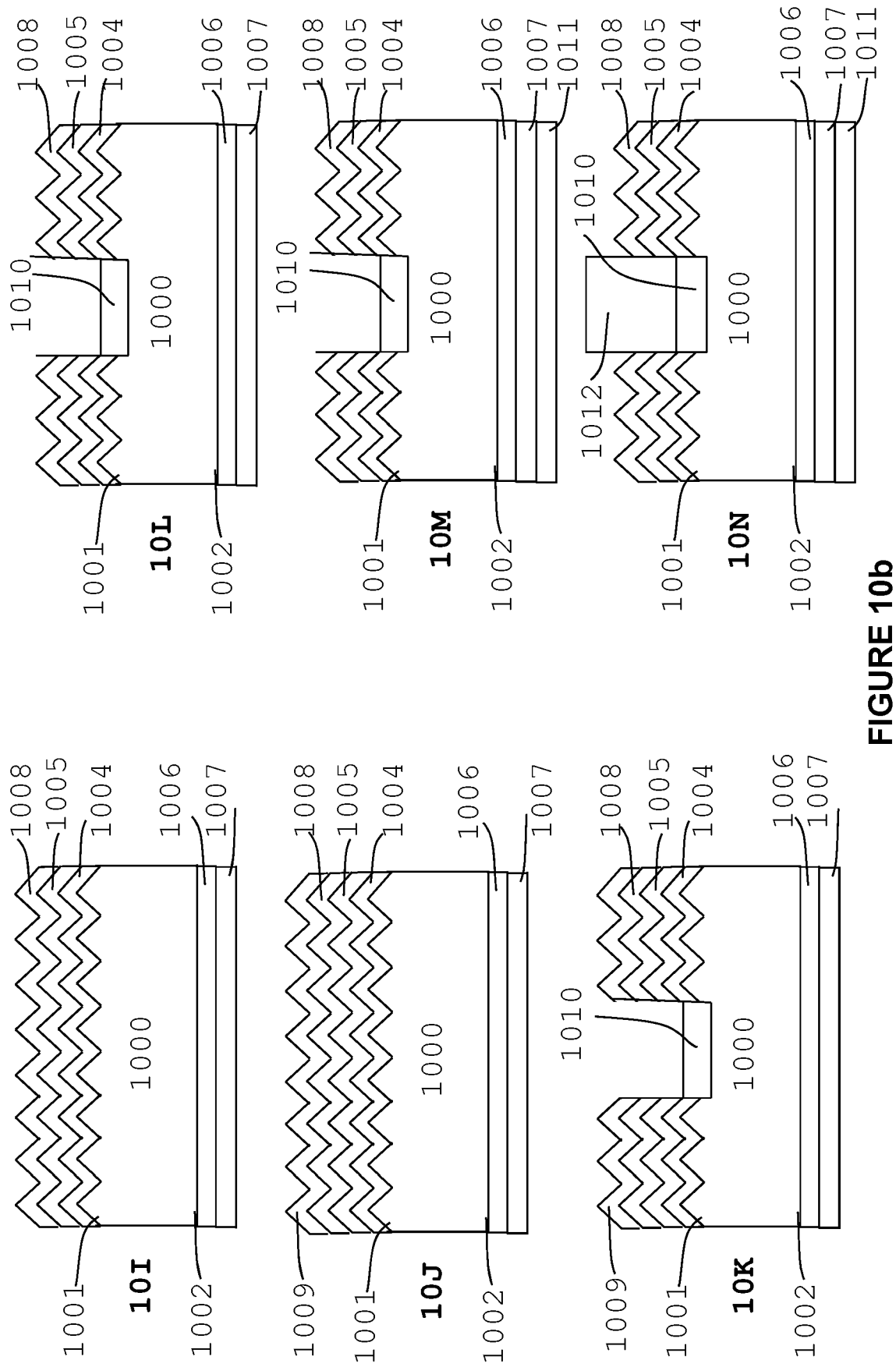

FIGS. 10a and 10b show schematic illustrations of a photovoltaic device with a homo-junction and a hetero-junction formed from polysilicon in accordance with embodiments.

In operation 10A, a crystalline silicon substrate 1000 is provided. This may be n-type or p-type.

In operation 10B, texturing is performed on the substrate to create surface 1001 on the light-receiving surface of the device and surface 1002 on the non-light receiving surface of the device.

In operation 10C, phosphorus diffusion is used to form heavily phosphorus doped regions 1003 near the silicon surfaces and lightly phosphorus doped regions 1004 extending further into the silicon. The heavily diffused regions 1003 are used to getter impurities from the bulk of the silicon.

In operation 10D, a chemical etch is performed to remove layers 1003 and 1004 from the rear of the device and planarise the rear surface. The process may also be used to remove layer 1003 from the light-receiving surface of the device and result in a surface doping concentration lower than $10^{20}/cm^3$.

In operation 10E, a thermal oxidation is performed to grow a thin thermal oxide layer 1005 on both surfaces of the device.

In operation 10F, a chemical process is used to remove layer 1005 from the rear of the device.

In operation 10G, a tunnel oxide layer 1006 is grown on rear surface of the device.

In operation 10H, a p-type polysilicon layer 1007 is formed onto layer 1006. Optionally this process incorporates minority carrier injection to allow the diffusion of hydrogen from the polysilicon layer into the bulk of the silicon and passivate defects in the bulk silicon. Alternatively, one or more layers of amorphous silicon featuring a layer of p-type amorphous silicon may be deposited onto layer 1006 and crystallised to form p-type polysilicon layer 1007. Preferably, this process incorporates minority carrier injection.

In operation 10I, a hydrogen-containing dielectric layer 1008 such as PECVD silicon nitride is deposited onto the light-receiving surface of the device. Optionally this process incorporates minority carrier injection.

In operation 10J, a phosphorus-containing layer 1009 such as phosphoric acid is deposited onto the light-receiving surface of the device.

In operation 10K, a laser process is used to define contact openings and locally open dielectric layers 1005 and 1008 on the front surface of the device and form localised heavily phosphorus-doped regions 1010.

In operation 10L, a chemical process is used to remove the residual phosphorus dopant layer 1009.

In operation 10M a hydrogenation process is performed at a temperature above 500° C. to release hydrogen from the dielectric layers and diffuse hydrogen throughout the device and passivate defects within the device. Preferably, this process incorporates minority carrier injection using illumination.

In operation 10N, a metal contact 1011 is formed on the rear of the device.

Subsequently, metal contacts are formed on regions 1010. This may be achieved by self-aligned light-induced plating of a stack of nickel/copper/silver. This process may involve an additional thermal treatment to form a layer of nickel silicide, typically in the range of 250° C. to 450° C., to prevent the diffusion of copper into the silicon. Optionally, this thermal process incorporates minority carrier injection to prevent the reactivation of defects passivated during the previous thermal processes.

An additional thermal process incorporating minority carrier injection is performed on the device to passivate defects in the device after the deposition of the metal contacts at a temperature below the temperature used for the operation 10M and the successive thermal process.

Figure 11:
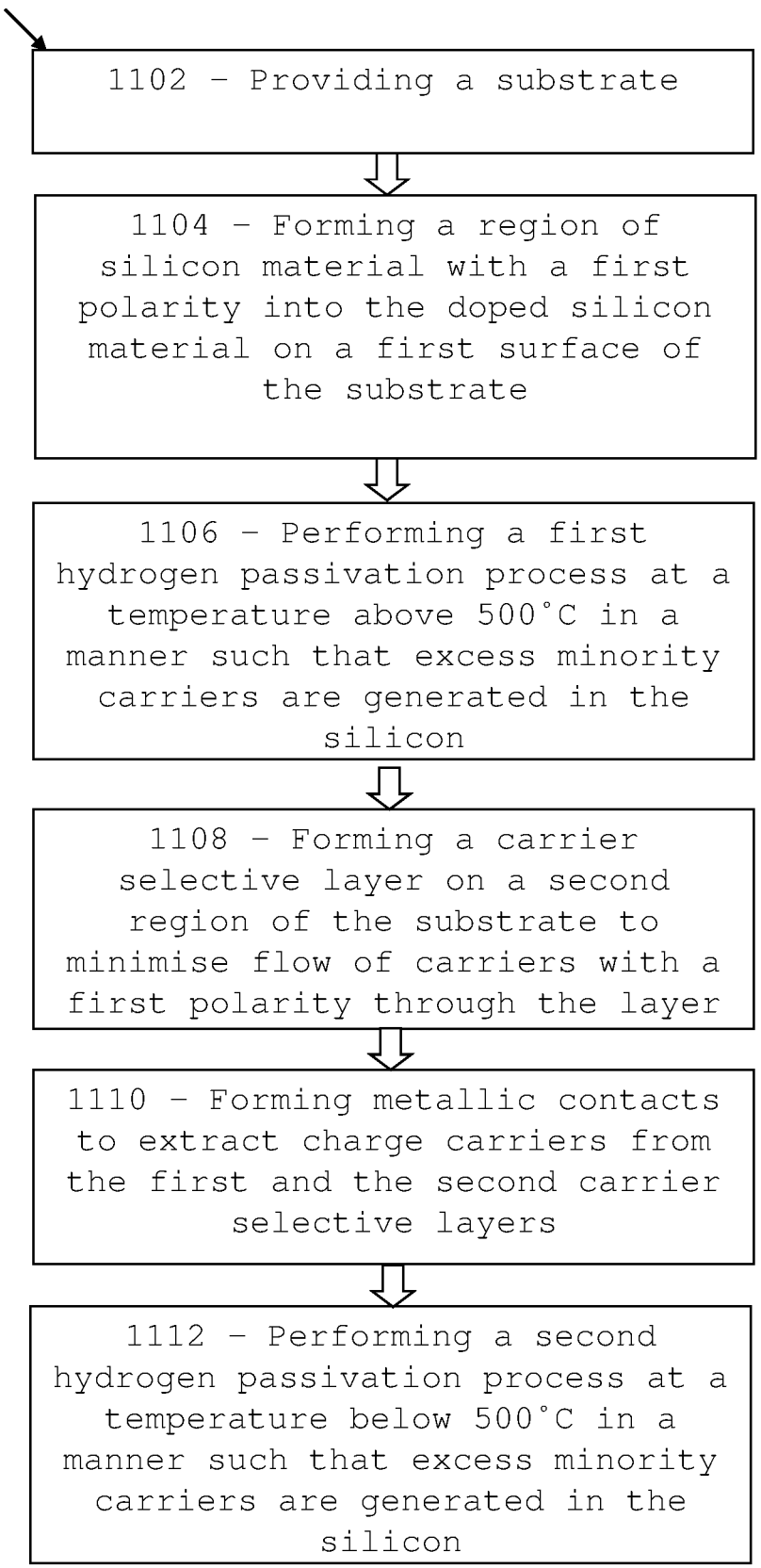

Referring now to FIG. 11, there is shown a flow diagram 1100 with a series of steps required to form a photovoltaic device comprising a carrier selective layer. An example of this type of cell with the carrier selective layer is hybrid homo-junction/MoO$_x$ heterojunction p-type contact photovoltaic device.

A silicon substrate is provided at step 1102 and both front and rear sides of the substrate are textured. At step 1104 phosphorus is then diffused in the silicon to form a region of silicon material with a first polarity (n-type) on a first surface of the substrate. The rear side of the cell is then chemically etched. From the first surface heavily phosphorous diffused layer is removed. After this, thermal oxidation is performed to grow a thin thermal oxide layer on both surfaces of the device. A hydrogen-containing dielectric layer such as PECVD silicon nitride is deposited onto the front surface of the device. Subsequent to this, an anti-reflection layer comprising of, for example, phosphoric acid is deposited onto the front surface of the device. After this, a laser process is used to form localised heavily phosphorus-doped regions followed by a chemical process for the removal of residual phosphorus dopant layer.

At step 1106, a first hydrogen passivation process at a temperature above 500° C. is performed to release hydrogen from the dielectric layers and diffuse hydrogen throughout the device and passivate defects within the device. This hydrogenation process is performed in a manner such that excess minority carriers are generated in the silicon. A chemical process is carried out to remove thermal oxide layer from the rear surface.

At step 1108, a carrier selective layer, such as MoO$_x$, is deposited on the rear surface. At step 1110, metal contacts are formed to extract charge carriers from the carrier selective layer.

A second hydrogen passivation process is performed at a temperature below 500° C. to generate excess minority carriers in the silicon material, step 1112.

Figure 12A:
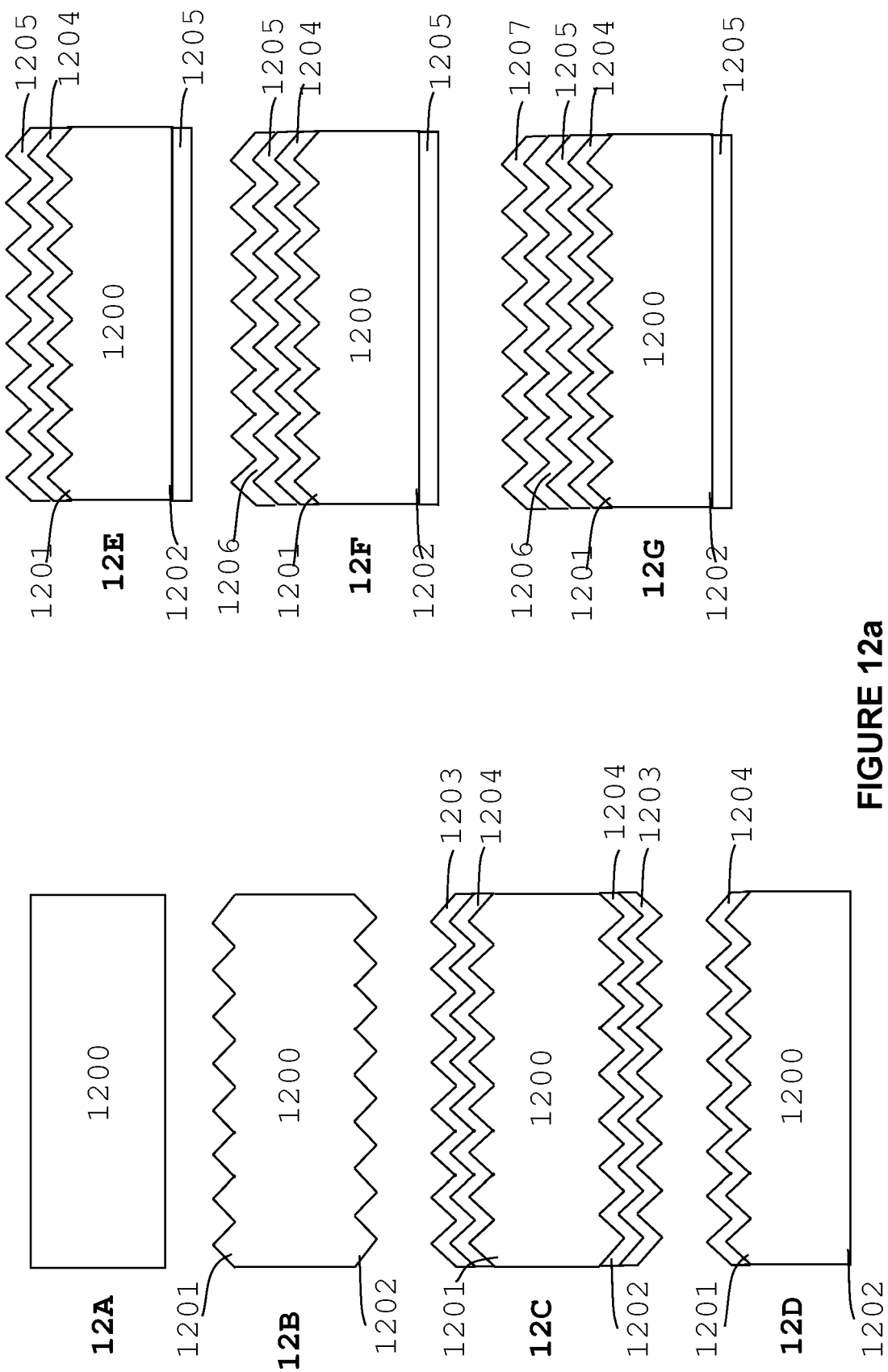
Figure 12B:
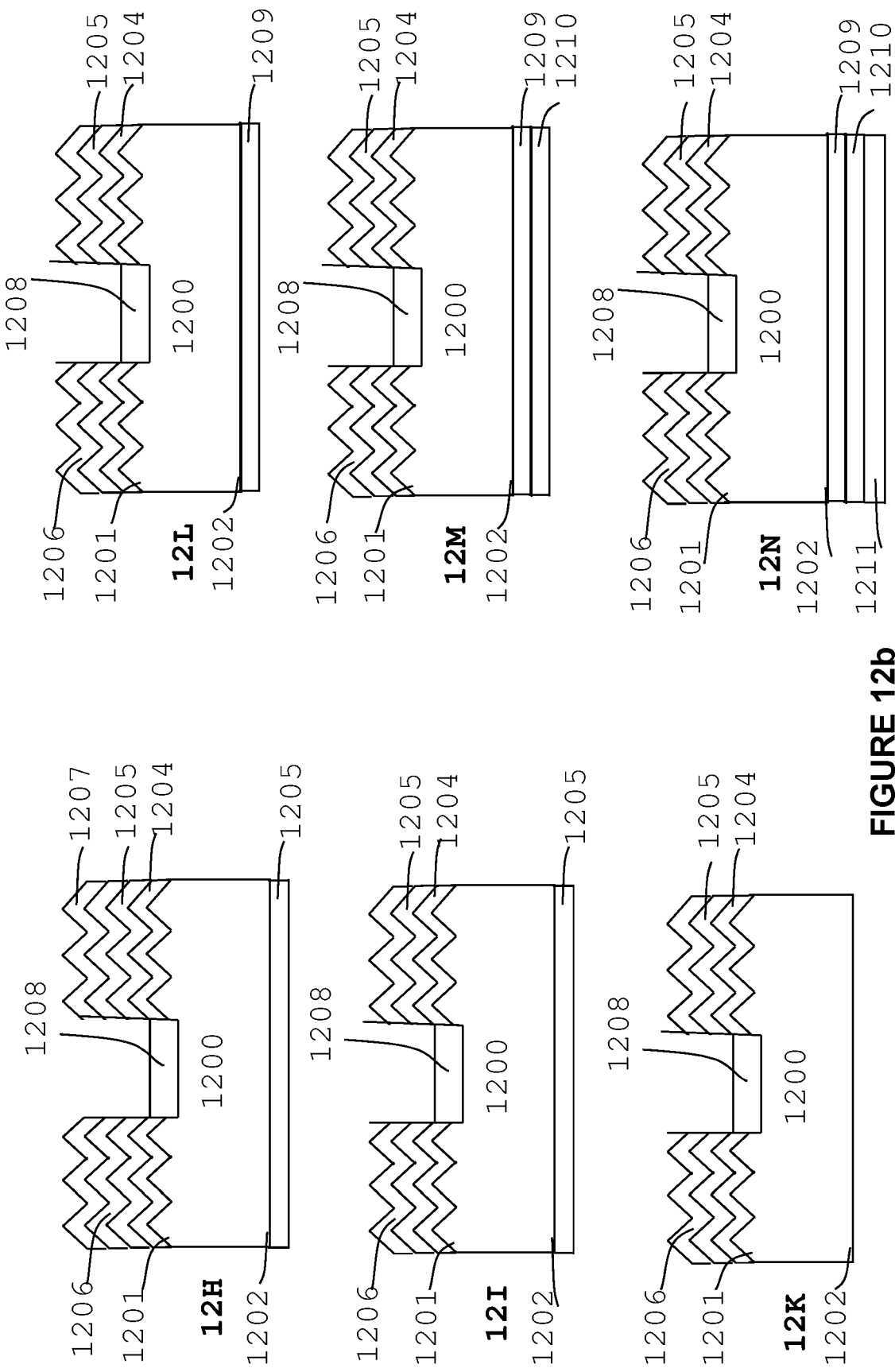
Figure 12C:
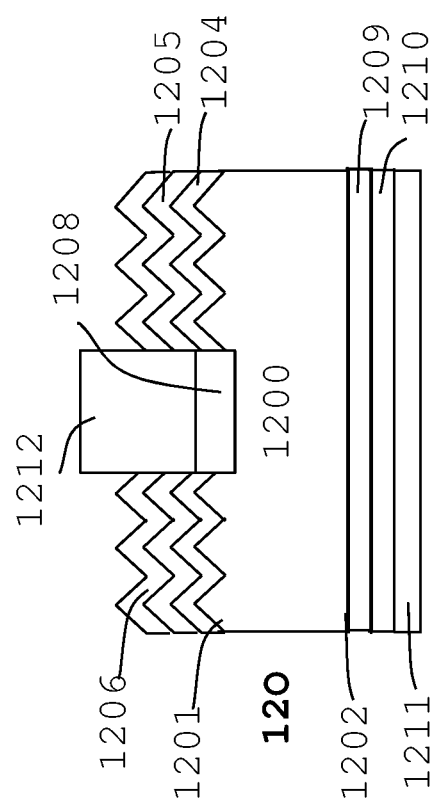

FIGS. 12a and 12b show schematic illustrations of a photovoltaic device comprising a carrier selective layer in accordance with embodiments. An example of such a cell is hybrid homo-junction/MoO$_x$ heterojunction p-type contact photovoltaic device.

In operation 12A, a crystalline silicon substrate 1200 is provided. This may be n-type or p-type.

In operation 12B, texturing is performed on the substrate to create surface 1201 on the light-receiving surface of the device and surface 1202 on the non-light receiving surface of the device.

In operation 12C, phosphorus diffusion is used to form heavily phosphorus doped regions 1203 near the silicon surfaces and lightly phosphorus doped regions 1204 extending further into the silicon. The heavily diffused regions 1203 are used to getter impurities from the bulk of the silicon.

In operation 12D, a chemical etch is performed to remove layers 1203 and 1204 from the rear of the device and planarise the rear surface. The process may also be used to remove layer 1203 from the light-receiving surface of the device and result in a surface doping concentration lower than $10^{20}/cm^3$.

In operation 12E, a thermal oxidation is performed to grow a thin thermal oxide layer 1205 on both surfaces of the device. In operation 12F a hydrogen-containing dielectric layer 1206 such as PECVD silicon nitride is deposited onto the light-receiving surface of the device. Optionally this process incorporates minority carrier injection. In operation 12G a phosphorus-containing layer 1207, such as phosphoric acid, is deposited onto the light-receiving surface of the device. In operation 12H, a laser process is used to define contact openings and locally open dielectric layers 1205 and 1206 on the front surface of the device and form localised heavily phosphorus-doped regions 1208. In operation 12I, a chemical process is used to remove the residual phosphorus dopant layer 1207.

In operation 12J, a hydrogenation process is performed at a temperature above 500° C. to release hydrogen from the dielectric layers and diffuse hydrogen throughout the device and passivate defects within the device. Preferably, this process incorporates minority carrier injection using illumination.

In operation 12K a chemical process is optionally performed on the rear surface of the device to remove layer 1205.

In operation 12L a tunneling and passivating layer 1209 is optionally grown on rear surface of the device. This may be comprised of intrinsic amorphous silicon or silicon oxide.

In operation 12M, a selective hole contact layer 1210 such as MoO$_x$ is deposited onto the rear surface 1202. In operation 12N a metal contact 1211 is formed on the rear of the device.

In operation 12O, metal contacts 1212 are formed on regions 1209. This may be achieved by self-aligned light-induced plating of a stack of nickel/copper/silver. This process may involve an additional thermal treatment to form a layer of nickel silicide, typically in the range of 250° C. to 450° C., to prevent the diffusion of copper into the silicon. Optionally, this thermal process incorporates minority carrier injection to prevent the reactivation of defects passivated during the previous thermal processes.

An additional thermal process incorporating minority carrier injection is performed on the device to passivate defects in the device after the deposition of the metal contacts at a temperature below the temperature used for the operation 12J and the thermal process in 12O. Optionally this is combined with the thermal process in operation 12O.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The term "comprising" (and its grammatical variations) as used herein are used in the inclusive sense of "having" or "including" and not in the sense of "consisting only of".

The invention claimed is:

1. A method for forming a hybrid silicon photovoltaic device, the method comprising the steps of:
   providing a substrate comprising doped silicon material;
   forming a region of silicon material with a first polarity into the doped silicon material on a first surface of the substrate; and
   forming a layer of poly-silicon with a second polarity on a second surface of the substrate; the second polarity being opposite to the first polarity; the second surface being opposite to the first surface;
   forming a dielectric layer that contains hydrogen on the region with the first polarity;
   subsequent to forming the dielectric layer, performing a first hydrogen passivation process at a temperature above 500° C. in a manner such that excess minority carriers are generated in the silicon material;
   forming metallic contacts to extract charge carriers from the region of silicon material with the first polarity and the layer of poly-silicon with the second polarity; and
   performing a second hydrogen passivation process at a temperature below 500° C. in a manner such that excess minority carriers are generated in the poly-silicon material;
   wherein the first hydrogen passivation process or the second hydrogen passivation process enables passivation of electrically active defects in the bulk region of the silicon material;
   wherein the second hydrogen passivation process comprises exposing the device to electromagnetic radiation, the electromagnetic radiation being such that photons with an energy higher than a bandgap of the poly-silicon material provide a power density of at least 10 mW/cm$^2$; and
   wherein at least one layer of poly-silicon is formed by thermally treating a layer of amorphous silicon and during the step of performing the second passivation process excess hydrogen formed during crystallisation of the amorphous silicon diffuses through the device to passivate electrically active defects.

2. The method of claim 1, wherein the method further comprises the step of depositing a tunnelling dielectric layer on the second surface of the substrate, prior to forming the layer of poly-silicon with the second polarity on the second surface.

3. The method of claim 1, wherein during the step of thermally treating the layer of amorphous silicon, excess carriers are generated in the silicon material to facilitate out-diffusion of hydrogen from the layer.

4. The method according to claim 1, wherein the step of performing the second passivation process has a duration shorter than 60 seconds.

5. The method according to claim 1, wherein the step of performing the second passivation process is performed at a temperature comprised between 100° C. and 250° C.

6. The method according to claim 1, wherein the step of performing the second passivation process has a duration shorter than 10 seconds.

7. The method of any one of the preceding claims, wherein the method further comprises the step of forming a layer of silicon material with a second polarity to getter impurities in the silicon material, the layer having a sheet resistance below 80 Ω/sq; and etching off a portion of the layer to remove the gettered impurities so that the sheet resistance of the etched layer increases to at least 100 Ω/sq.

8. The method according to claim 1, wherein the method further comprises the step of exposing the device to radiation during the step of forming poly-silicon to help the diffusion of hydrogen into the silicon.

* * * * *